(12) United States Patent
Yu et al.

(10) Patent No.: US 11,961,564 B2
(45) Date of Patent: Apr. 16, 2024

(54) NONVOLATILE MEMORY DEVICE WITH INTERMEDIATE SWITCHING TRANSISTORS AND PROGRAMMING METHOD

(71) Applicant: Samsung Electronics Co., Ltd., Suwon-si (KR)

(72) Inventors: Chang-Yeon Yu, Hwaseong-si (KR); Kui-Han Ko, Seoul (KR); Il-Han Park, Suwon-si (KR); June-Hong Park, Seongnam-si (KR); Joo-Yong Park, Bucheon-si (KR); Joon-Young Park, Seoul (KR); Bong-Soon Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 172 days.

(21) Appl. No.: 17/503,952

(22) Filed: Oct. 18, 2021

(65) Prior Publication Data

US 2022/0036954 A1    Feb. 3, 2022

Related U.S. Application Data

(63) Continuation-in-part of application No. 16/141,147, filed on Sep. 25, 2018, now Pat. No. 11,183,249.

(30) Foreign Application Priority Data

Dec. 22, 2017    (KR) .......................... 10-2017-0178312

(51) Int. Cl.
*G11C 16/10*    (2006.01)
*G11C 16/04*    (2006.01)
(Continued)

(52) U.S. Cl.
CPC ........ *G11C 16/102* (2013.01); *G11C 16/0433* (2013.01); *G11C 16/08* (2013.01);
(Continued)

(58) Field of Classification Search
CPC ... G11C 16/102; G11C 16/0433; G11C 16/08; G11C 16/24; G11C 16/26;
(Continued)

(56) References Cited

U.S. PATENT DOCUMENTS 6,850,439 B1 *    2/2005    Tanaka ............... G11C 16/0483
                                                              365/185.11
8,559,224 B2     10/2013    Han et al.
(Continued)

FOREIGN PATENT DOCUMENTS

CN    107017021 A    8/2017
KR    101692520 B1    1/2017

OTHER PUBLICATIONS

Office Action dated Feb. 19, 2024 from the Chinese Patent Office for Chinese Patent Application No. 201811556056.X.

*Primary Examiner* — Donald H B Braswell
(74) *Attorney, Agent, or Firm* — Muir Patent Law, PLLC

(57) ABSTRACT

To program in a nonvolatile memory device including a cell region including first metal pads and a peripheral region including second metal pads and vertically connected to the cell region by the first metal pads and the second metal pads, a memory block is provided with a plurality of sub blocks disposed in a vertical direction where the memory block includes a plurality of cell strings each including a plurality of memory cells connected in series and disposed in the vertical direction. A plurality of intermediate switching transistors are disposed in a boundary portion between two adjacent sub blocks in the vertical direction. Each of the plurality of intermediate switching transistors is selectively activated based on a program address during a program operation. The selectively activating each of the plurality of intermediate switching transistors includes selectively turning on one or more intermediate switching transistors in a selected cell string based on the program address.

19 Claims, 32 Drawing Sheets

(51) Int. Cl.
  *G11C 16/08* (2006.01)
  *G11C 16/24* (2006.01)
  *G11C 16/26* (2006.01)

(52) U.S. Cl.
  CPC .............. *G11C 16/24* (2013.01); *G11C 16/26* (2013.01); *G11C 16/0483* (2013.01)

(58) Field of Classification Search
  CPC ..... G11C 11/5628; G11C 16/10; G11C 16/32; G11C 16/3427; G11C 16/0483; G11C 2211/5648
  See application file for complete search history.

(56) References Cited

U.S. PATENT DOCUMENTS

| | | |
|---|---|---|
| 8,559,235 B2 | 10/2013 | Yoon et al. |
| 8,877,626 B2 | 11/2014 | Lee et al. |
| 8,908,431 B2 | 12/2014 | Shim et al. |
| 8,951,865 B2 | 2/2015 | Goda |
| 9,564,499 B2 | 2/2017 | Seol et al. |
| 9,595,319 B2 | 3/2017 | Lee |
| 9,595,346 B2 | 3/2017 | Lee et al. |
| 9,754,963 B1 | 9/2017 | Kawamura et al. |
| 9,761,606 B1 | 9/2017 | Ishida et al. |
| 9,780,034 B1 | 10/2017 | Tsutsumi et al. |
| 9,905,298 B2 | 2/2018 | Joo |
| 2015/0109862 A1* | 4/2015 | Shibata .................... G11C 8/14 257/314 |
| 2016/0259576 A1* | 9/2016 | Asami ................... G06F 3/0659 |
| 2016/0314833 A1* | 10/2016 | Lee .................... G11C 16/3418 |
| 2021/0232744 A1* | 7/2021 | Lin .................. H03K 3/356113 |

\* cited by examiner

FIG. 20

B2T(SB1 PROGRAM)

| STRING | SELECTED | UNSELECTED |
|---|---|---|
| BL | VPER/VINH | |
| SSL – SST | VSON | VSOFF |
| WLu – MC12 (SB3) | VPASS2 | |
| WLu – MC11 | | |
| WLu – MC10 | | |
| WLu – MC9 | | |
| USL – MC8 (BNDU) | VUON | VUOFF |
| WLu – MC7 (SB2) | VPASS2 | |
| WLu – MC6 | | |
| WLu – MC5 | | |
| LSL – MC4 (BNDL) | VBON | VBOFF |
| WLu – MC3 (SB1) | VPASS1 | |
| WLs – MC2 | VPGM | |
| WLu – MC1 | VPASS1 | |
| GSL – GST | VGOFF | |
| CSL/SUB | GND | |

FIG. 21

BZT(SB2 PROGRAM)

| STRING | SELECTED | UNSELECTED |
|---|---|---|
| BL | VPER/VINH | |
| SSL—SST | VSON | VSOFF |
| WLu—MC12 | VPASS2 | |
| WLu—MC11 | | |
| WLu—MC10 | | |
| WLu—MC9 | | |
| USL—MC8 | VUON | VUOFF |
| WLu—MC7 | VPASS1 | |
| WLs—MC6 | VPGM | |
| WLu—MC5 | VPASS1 | |
| LSL—MC4 | VBOFF | VBOFF |
| WLu—MC3 | VLOW | |
| WLu—MC2 | | |
| WLu—MC1 | | |
| GSL—GST | VGOFF | |
| CSL/SUB | GND | |

SB3: MC12–MC9
BNDU: MC8
SB2: MC7–MC5
BNDL: MC4
SB1: MC3–MC1

FIG. 22

B2T(SB3 PROGRAM)

| STRING | | SELECTED | UNSELECTED |
|---|---|---|---|
| | BL | VPER/VINH | |
| | SSL—SST | VSON | VSOFF |
| SB3 { | WLu—MC12 | VPASS1 | |
| | WLs—MC11 | VPGM | |
| | WLu—MC10 | VPASS1 | |
| | WLu—MC9 | | |
| BNDU { | USL—MC8 | VUOFF | VUOFF |
| SB2 { | WLu—MC7 | VLOW | |
| | WLu—MC6 | | |
| | WLu—MC5 | | |
| BNDL { | LSL—MC4 | VBOFF | VBOFF |
| SB1 { | WLu—MC3 | VLOW | |
| | WLu—MC2 | | |
| | WLu—MC1 | | |
| | GSL—GST | VGOFF | |
| | CSL/SUB | GND | |

FIG. 23

T2B(SB1 PROGRAM)

| STRING | SELECTED | UNSELECTED |
|---|---|---|
| BL | VPER/VINH | |
| SSL – SST | VSON | VSOFF |
| WLu – MC12 (SB3) | VPASS1 | |
| WLu – MC11 (SB3) | | |
| WLu – MC10 (SB3) | | |
| WLu – MC9 (SB3) | | |
| USL – MC8 (BNDU) | VUON | VUOFF |
| WLu – MC7 (SB2) | VPASS1 | |
| WLu – MC6 (SB2) | | |
| WLu – MC5 (SB2) | | |
| LSL – MC4 (BNDL) | VBON | VBOFF |
| WLu – MC3 (SB1) | VPASS1 | |
| WLs – MC2 (SB1) | VPGM | |
| WLu – MC1 (SB1) | VPASS1 | |
| GSL – GST | VGOFF | |
| CSL/SUB | GND | |

FIG. 24

T2B(SB2 PROGRAM)

| STRING | SELECTED | UNSELECTED |
|---|---|---|
| BL | VPER/VINH ||
| SSL – SST | VSON | VSOFF |
| WLu – MC12 | VPASS1 ||
| WLu – MC11 | ||
| WLu – MC10 | ||
| WLu – MC9 | ||
| USL – MC8 | VUON | VUOFF |
| WLu – MC7 | VPASS1 ||
| WLs – MC6 | VPGM ||
| WLu – MC5 | VPASS1 ||
| LSL – MC4 | VBOFF | VBOFF |
| WLu – MC3 | VLOW ||
| WLu – MC2 | ||
| WLu – MC1 | ||
| GSL – GST | VGOFF ||
| CSL/SUB | GND ||

SB3: MC12, MC11, MC10, MC9
BNDU: MC8
SB2: MC7, MC6, MC5
BNDL: MC4
SB1: MC3, MC2, MC1

FIG. 25

T2B(SB3 PROGRAM)

| STRING | | SELECTED | UNSELECTED |
|---|---|---|---|
| | BL | VPER/VINH | |
| | SSL — SST | VSON | VSOFF |
| SB3 { WLu — MC12 | VPASS1 | |
| | WLs — MC11 | VPGM | |
| | WLu — MC10 | VPASS1 | |
| | WLu — MC9 | | |
| BNDU { | USL — MC8 | VUOFF | VUOFF |
| | WLu — MC7 | | |
| SB2 { | WLu — MC6 | VLOW | |
| | WLu — MC5 | | |
| BNDL { | LSL — MC4 | VBOFF | VBOFF |
| | WLu — MC3 | | |
| SB1 { | WLu — MC2 | VLOW | |
| | WLu — MC1 | | |
| | GSL — GST | VGOFF | |
| | CSL/SUB | GND | |

NONVOLATILE MEMORY DEVICE WITH INTERMEDIATE SWITCHING TRANSISTORS AND PROGRAMMING METHOD

CROSS-REFERENCE TO RELATED APPLICATION(S)

This application is a continuation-in-part application of U.S. application Ser. No. 16/141,147 filed on Sep. 25, 2018, now allowed, which claims priority under 35 USC § 119 to Korean Patent Application No. 10-2017-0178312, filed on Dec. 22, 2017, in the Korean Intellectual Property Office (KIPO), the disclosure of each of which is incorporated by reference in its entirety herein.

BACKGROUND

1. Technical Field

Example embodiments relate generally to semiconductor integrated circuits, and more particularly to a nonvolatile memory device and a method of programming in a nonvolatile memory device.

2. Discussion of the Related Art

Nonvolatile memory devices may maintain stored data even though power is off. While volatile memory devices are widely used as main memories of various apparatuses, nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increases in the integration degree and memory capacity, disturbance on unselected memory cells increases while selected memory cells are programmed.

SUMMARY

Some example embodiments may provide a method of programming in a nonvolatile memory device capable of reducing disturbance on unselected memory cells during a program operation.

Some example embodiments may provide a nonvolatile memory device capable of reducing disturbance on unselected memory cells during a program operation.

According to example embodiments, a nonvolatile memory device includes a plurality of first metal pads in a cell region and a plurality of second metal pads in a peripheral region disposed under the cell region, a first memory block in the cell region, a plurality of intermediate switching transistors and a control circuit in the peripheral region. The peripheral region is vertically connected to the cell region by the first metal pads and the second metal pads. The first memory block is divided into a plurality of sub blocks and includes a plurality of cell strings each comprising a plurality of memory cells connected in series and disposed in a vertical direction. The plurality of intermediate switching transistors are disposed in a boundary portion between two adjacent sub blocks in the first memory block in the vertical direction. The control circuit selectively turns on one or more intermediate switching transistors in a selected cell string of the first memory block independently of intermediate switching transistors in unselected cell strings of the first memory block based on a program address during a program operation.

According to example embodiments, to program in a nonvolatile memory device comprising a cell region including a plurality of first metal pads and a peripheral circuit region including a plurality of second metal pads and vertically connected to the memory cell region by the plurality of first metal pads and the plurality of second metal pads, a memory block in the cell region is provided with a plurality of sub blocks disposed in a vertical direction where the memory block includes a plurality of cell strings connected to a plurality of bit lines, each cell string including a plurality of memory cells connected in series and disposed in the vertical direction. A plurality of intermediate switching transistors are disposed in a boundary portion between two adjacent sub blocks in the vertical direction. Each of the plurality of intermediate switching transistors is selectively activated by a control circuit in the peripheral region based on a program address during a program operation. The selectively activating each of the plurality of intermediate switching transistors includes selectively turning on one or more intermediate switching transistors in a selected cell string based on the program address.

According to example embodiments, a method of programming in a nonvolatile memory device comprising a cell region including a plurality of first metal pads and a peripheral circuit region including a plurality of second metal pads and vertically connected to the memory cell region by the plurality of first metal pads and the plurality of second metal pads, includes, providing a memory block in the cell region, the memory block comprising a first sub block below a stopper layer and a second sub block above the stopper layer where the memory block includes a plurality of cell strings connected to a plurality of bit lines, each cell string comprising a plurality of memory cells connected in series and disposed in a vertical direction, providing a plurality of intermediate switching transistors disposed in the stopper layer, turning on, by a control circuit in the peripheral region, one or more intermediate switching transistors in a selected cell string in response to a first string selection transistor connected to a first bit line of the plurality of bit lines in the selected cell string being activated during a program operation, and turning off, by the control circuit, the one or more intermediate switching transistors in an unselected cell string adjacent to the selected cell string in a first direction in response to a second string selection transistor connected to the first bit line in the unselected cell string being inactivated during the program operation.

BRIEF DESCRIPTION OF THE DRAWINGS

Example embodiments of the present disclosure will be more clearly understood from the following detailed description taken in conjunction with the accompanying drawings.

FIGS. 20 through 22 are timing diagrams illustrating program operations of sub blocks in FIG. 19 according to the first program scenario of FIG. 11.

FIGS. 23 through 25 are timing diagrams illustrating program operations of sub blocks in FIG. 19 according to the second program scenario of FIG. 14.

DETAILED DESCRIPTION

Figure 1:
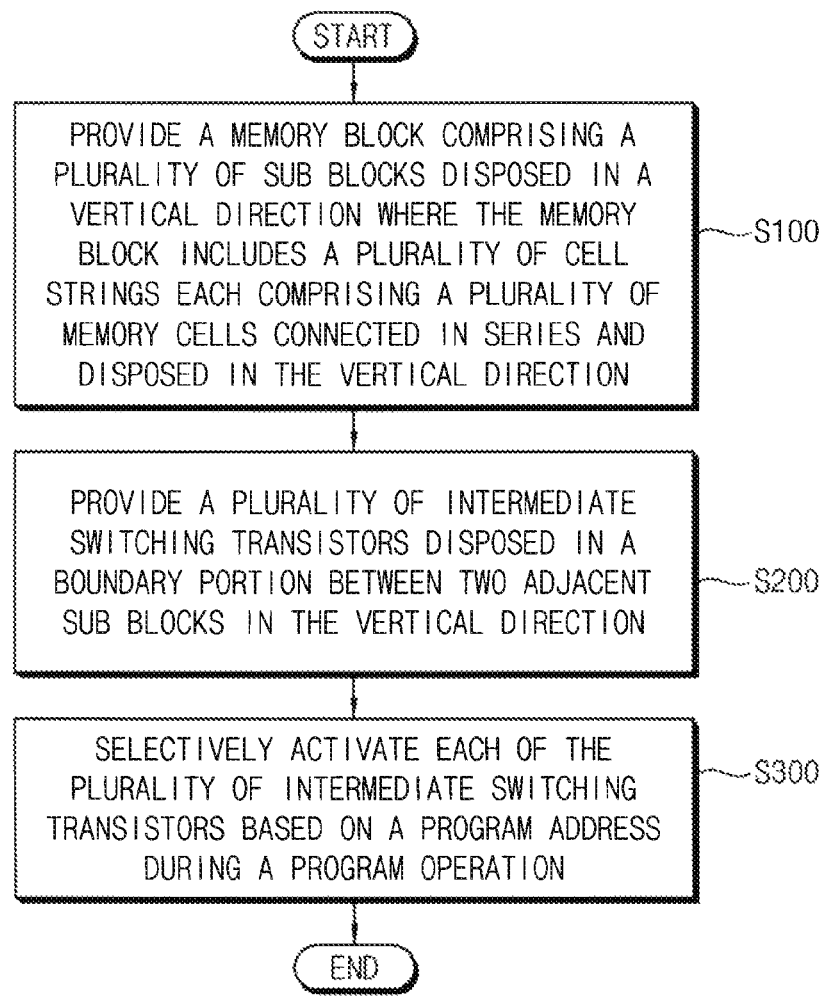
FIG. 1 is a flow chart illustrating a method of programming in a nonvolatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of programming in a nonvolatile memory device according to example embodiments.

Referring to FIG. 1, a memory block includes a plurality of sub blocks disposed in a vertical direction where the memory block includes a plurality of cell strings each comprising a plurality of memory cells connected in series and disposed in the vertical direction (S100). The memory block may be divided into two sub blocks as will be described below with reference to FIG. 7, three sub blocks as will be described below with reference to FIG. 19, and in the same way four or more sub blocks.

A plurality of intermediate switching transistors are disposed in a boundary portion between two adjacent sub blocks of the plurality of sub blocks in the vertical direction (S200). In some example embodiments, as will be described below with reference to FIGS. 7, 8A and 8B, the boundary portion may correspond to one gate layer. In other example embodiments, as will be described below with reference to FIG. 9A, the boundary portion may correspond to two or more gate layers that are adjacent in the vertical direction. In still other example embodiments, as will be described below with reference to FIG. 19, the boundary portion may correspond to two or more gate layers that are spaced apart in the vertical direction. Here, the gate layers indicate the conductive materials 213 to 293 in FIG. 5, that is, gate layers in which gate lines GTL1~GTL8 in FIG. 6 are formed. In example embodiments, the boundary portion (or, a stopper layer) may be referred to as an area including one or more transistors not connected to word lines, string selection lines, and ground selection lines in each cell string. The boundary portion may also be referred to as a separate portion between an upper channel hole and a lower channel hole of a channel hole in each cell string.

Each of the plurality of intermediate switching transistors is selectively activated based on a program address during a program operation (S300). For example, each of the plurality of intermediate switching transistors may be individually and independently selectively activated based on a program address. The selective activating based on the program address will be described below with reference to FIGS. 11 through 25.

As the number of the word lines formed in the gate layers stacked in the vertical direction is increased to increase the density of each memory block, the pass voltage disturbance on the memory cells connected to the unselected word lines during the program operation is increased. Also the program voltage disturbance on the memory cells connected to the selected word line but included in the unselected cell strings is increased as the number of the cell strings in each memory block is increased.

The nonvolatile memory device and the method of programming in the nonvolatile memory device according to example embodiments may reduce a program voltage disturbance and a pass voltage disturbance and thus increase performance and lifetime of the nonvolatile memory device through independent switching of the intermediate switching transistors to implement local boosting of string segments irrelevant to programming. Here the local boosting indicates that an entire channel is not boosted but a portion of a channel, that is, a boosted channel segment is boosted by a pass voltage and/or a program voltage.

Figure 2:
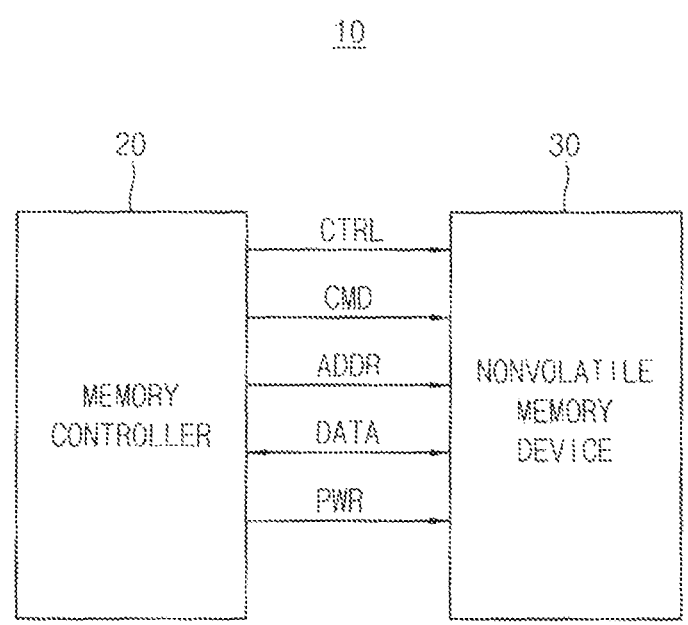
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and at least one memory device 30.

The memory device 30 may be a nonvolatile memory device as described herein. The memory system 10 may include data storage media based on flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

Figure 3:
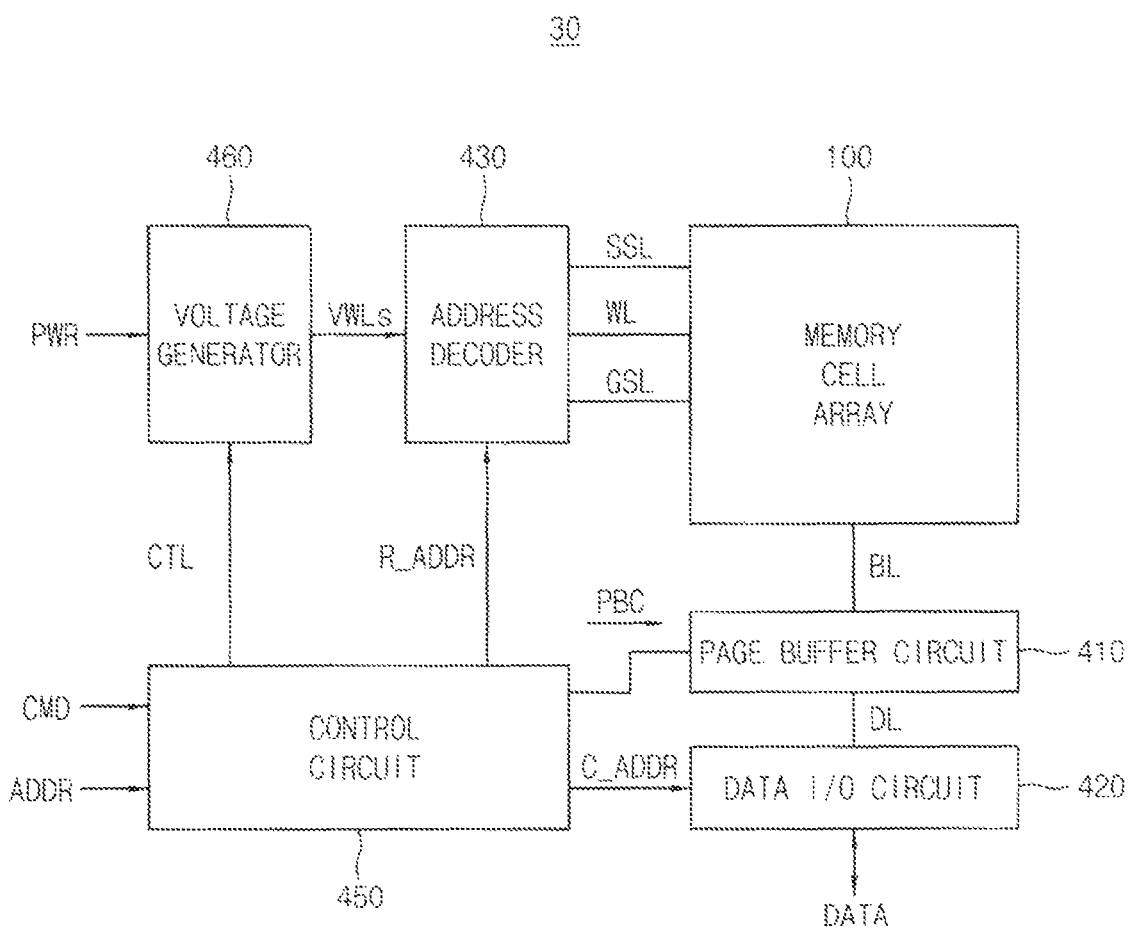
FIG. 3 is a block diagram illustrating an example embodiment of a nonvolatile memory device included in the memory system of FIG. 2.

FIG. 3 is a block diagram illustrating an example embodiment of a nonvolatile memory device included in the memory system of FIG. 2.

Referring to FIG. 3, the nonvolatile memory device 30 includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the nonvolatile memory device 30 based on the command signal CMD and the address signal ADDR. An erasure operation may comprise performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device 30, such as to the memory controller 20). That is, the page buffer circuit 410 and the data input/output circuit 420 may perform a copy-back operation.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

As will be described below with reference to FIG. 27, the nonvolatile memory device 30 may have a chip-to-chip (C2C) structure in which an upper chip includes a memory cell region (or cell region) (e.g., a cell region CREG) on a first wafer, and a lower chip includes a peripheral circuit region (or peripheral region) (e.g., the peripheral region PREG) on a second wafer. The memory cell array 100 may be included in the upper chip and peripheral circuits such as the page buffer circuit 410, the data input/output circuit 420, the address decoder 430, the control circuit 450 and the voltage generator 460 may be included in the lower chip. In this case, the voltage or signals applied to the plurality of intermediate switching lines MSL, the plurality of word lines WL and the plurality of string selection lines SSL may be generated in the lower chip and then provided to the upper chip.

Figure 4:
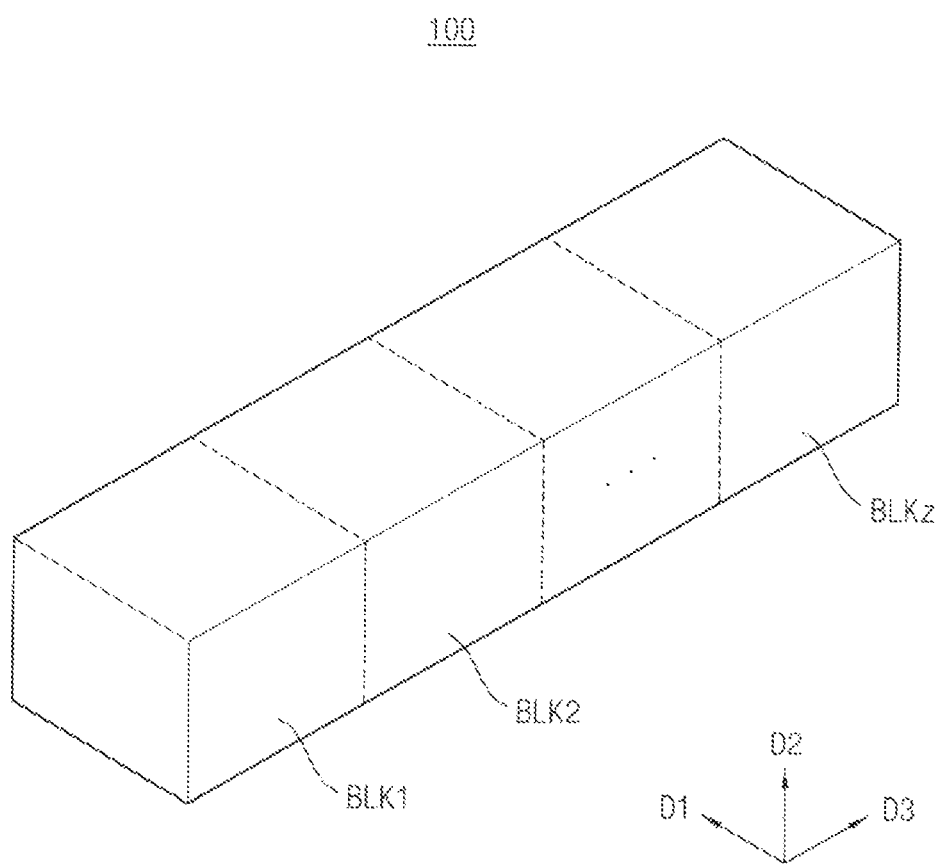
FIG. 4 is a block diagram illustrating a memory cell array included in the nonvolatile memory device of FIG. 3.
Figure 5:
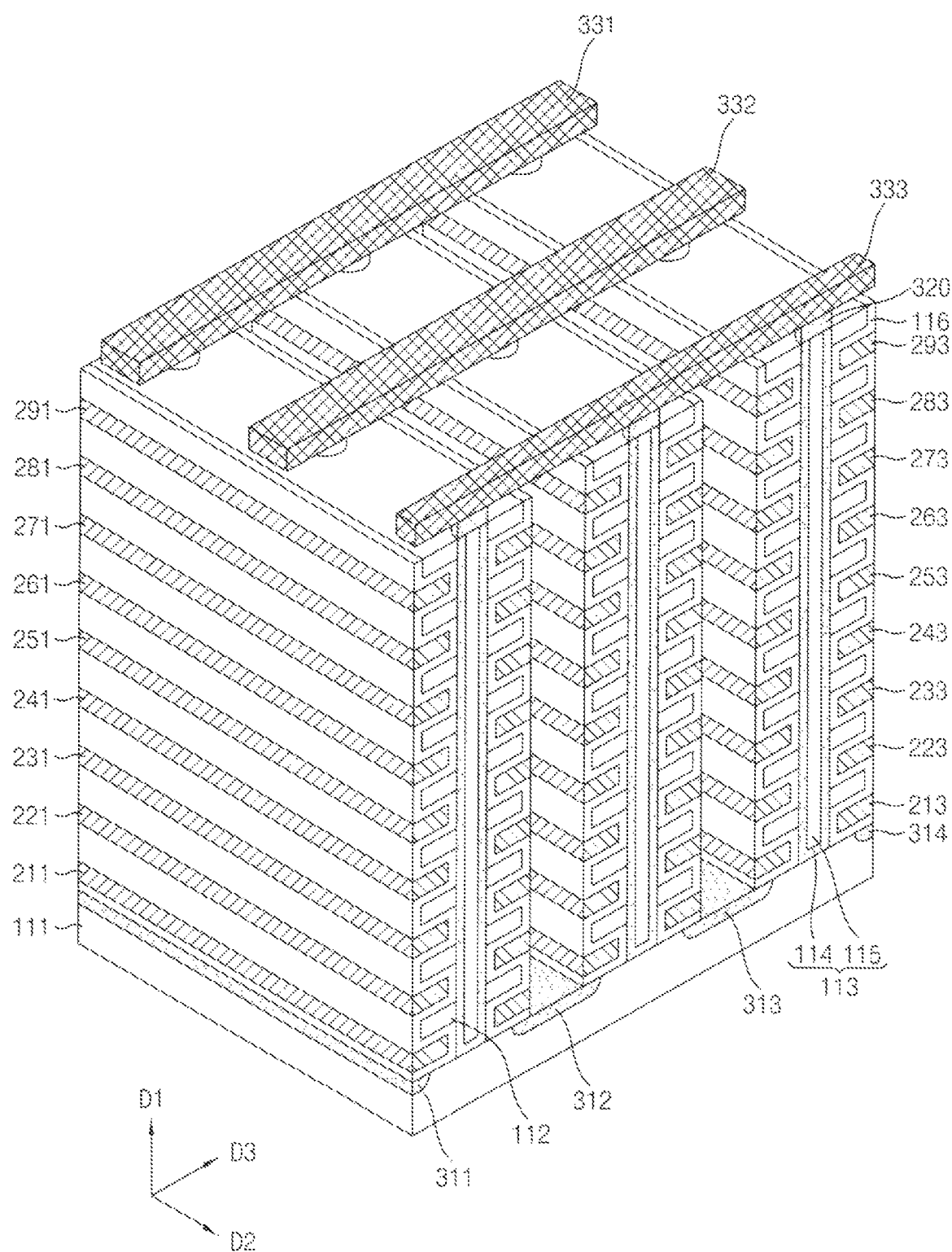
FIG. 5 is a perspective view illustrating one of memory blocks of FIG. 4.
Figure 6:
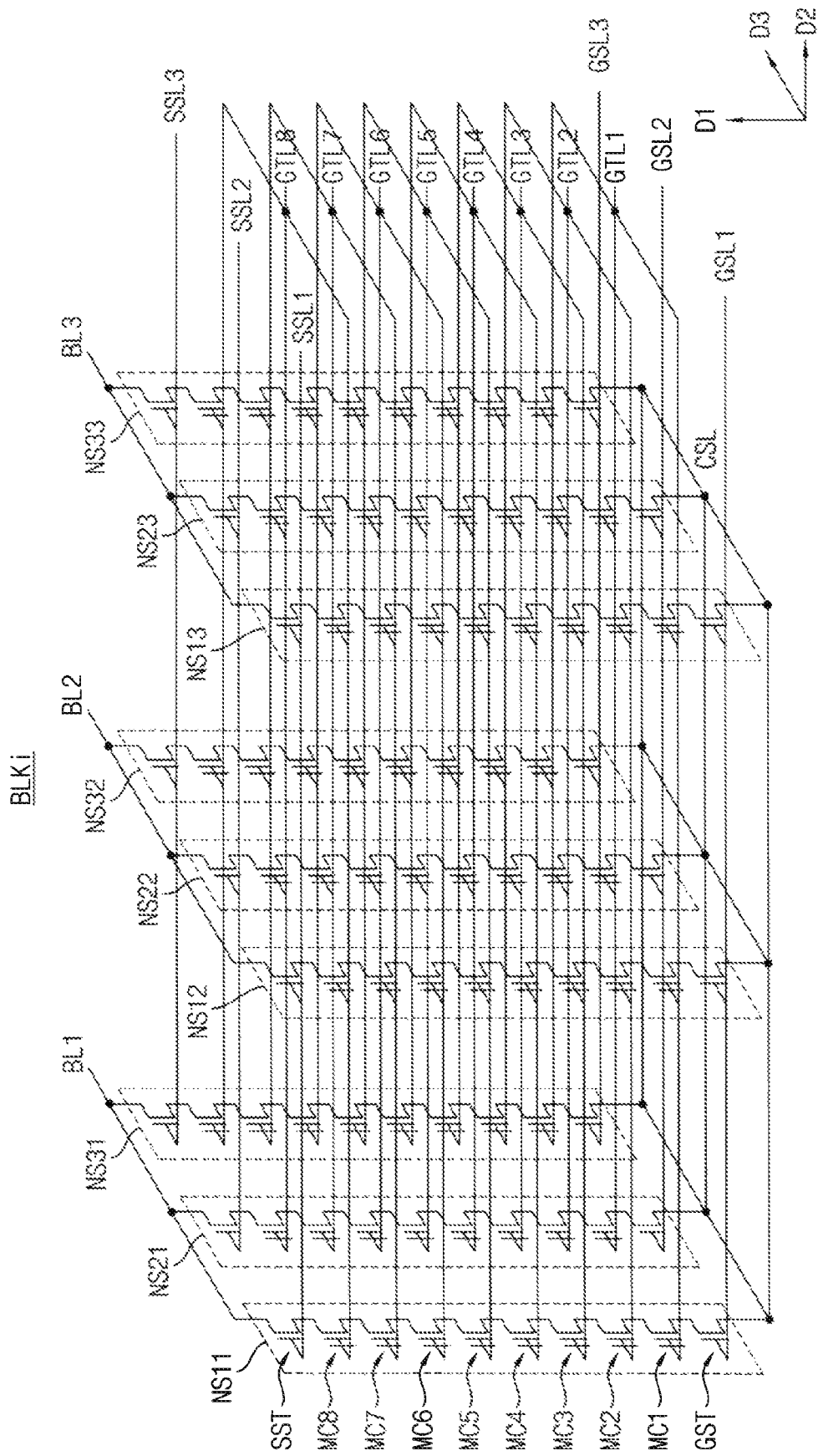
FIG. 6 is a circuit diagram illustrating an equivalent circuit of the memory block described with reference to FIG. 5.

FIG. 4 is a block diagram illustrating a memory cell array included in the nonvolatile memory device of FIG. 3, and FIG. 5 is a perspective view illustrating one of memory blocks of FIG. 4.

Referring to FIG. 4, the memory cell array 100 may include a plurality of memory blocks BLK1 to BLKz. In an embodiment, the memory blocks BLK1 to BLKz are selected by the address decoder 430 in FIG. 3. For example, the address decoder 430 may select a particular memory block BLK corresponding to a block address among the memory blocks BLK1 to BLKz.

Referring to FIG. 5, a memory block BLKi includes NAND strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the second direction D2 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the first direction D1 on a region of the substrate 111 between the first and second doping regions 311 and 312. For example, the plurality of insulation materials 112 are provided along the first direction D1, being spaced by a specific distance. For example, the insulation materials 112 may include an insulation material such as an oxide layer.

A plurality of pillars 113 penetrating the insulation materials along the first direction D1 are sequentially disposed along the second direction D2 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312.

A plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the first direction D1, an insulation layer 116 provided on the exposed surfaces of the plurality of insulation materials 112 and the plurality of pillars 113, and a plurality of conductive materials 213 to 293 extending along the second direction D2.

Drains 320 are provided on the plurality of pillars 113, respectively. On the drains, the second conductive materials 331 to 333 extending along the third direction D3 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

The layers in which the first conductive materials are formed correspond to gate layers and the first conductive materials may form gate lines such as a string selection line SSL, a word line WL, intermediate switching lines MSL, USL and LSL, a ground selection line GSL, etc. The second conductive materials may form a bit line BL.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 6, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 6, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 6, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Hereinafter, the memory cells may be omitted and only the gate lines stacked in the vertical direction may be illustrated in figures of a memory block for convenience of illustration. The gate lines may include a string selection line SSL, a word line WL, a dummy word line DWL, intermediate switching lines MSL, USL and LSL and a ground selection line GSL. The transistors driven by the intermediate switching lines MSL, USL and LSL may be referred to as intermediate switching transistors. For convenience of illustration and description, only four cell strings STR1~STR4 are connected to a same bit line BL in following figures. However, example embodiments are not limited thereto, and the number of cell strings may be determined variously.

Figure 7:
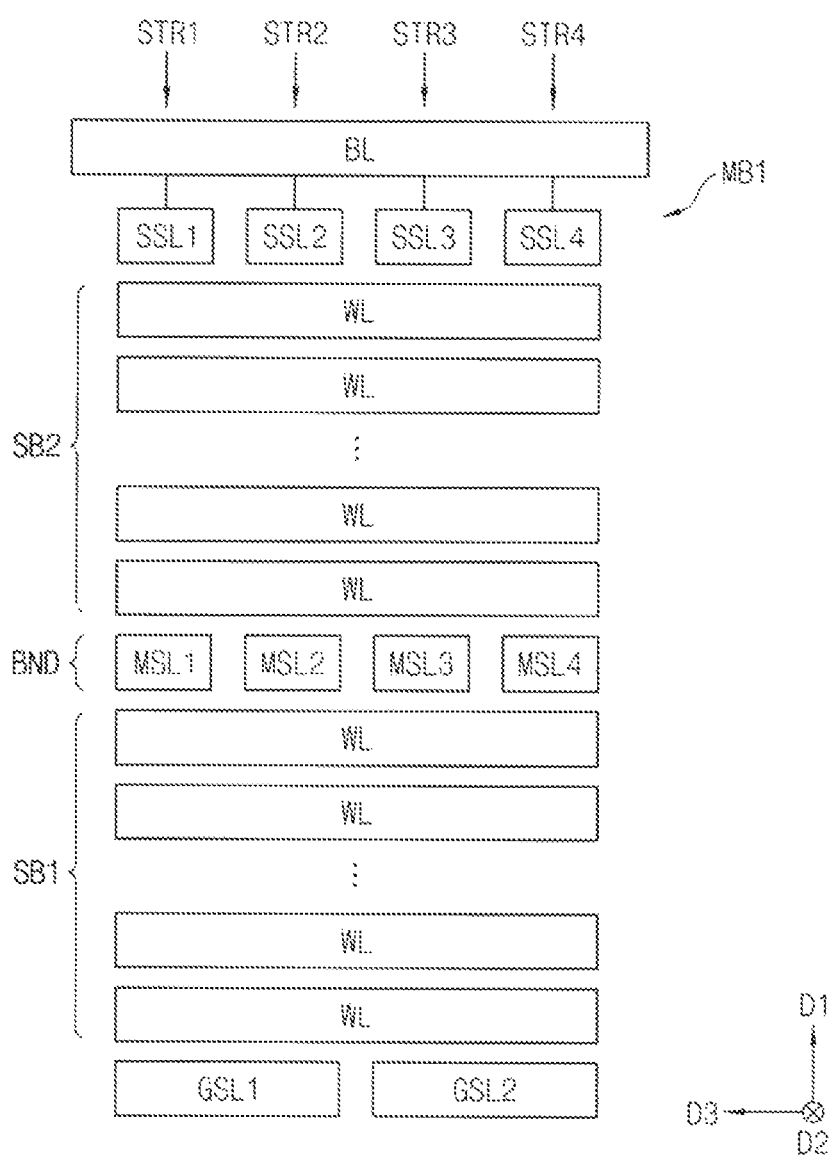
FIG. 7 is a cross-sectional view illustrating a memory block according to example embodiments.

FIG. 7 is a cross-sectional view illustrating a memory block according to example embodiments.

Referring to FIG. 7, a memory block MB1 may include a first sub block SB1 disposed below a boundary portion BND and a second sub block SB2 disposed above the boundary portion BND. For example, memory cells connected to a selected word line corresponding to a program address in the first sub block SB1 are disposed vertically between the common source line CSL and the boundary portion BND. For example, memory cells connected to a selected word line corresponding to a program address in the second sub block SB2 are disposed vertically between a corresponding bit line and the boundary portion BND. As described with reference to FIGS. 5 and 6, the memory block MB1 may include a plurality of cell strings STR1~STR4 (e.g., NAND strings NS11 to NS41), and each of the cell strings STR1~STR4 may include a plurality of memory cells disposed in the vertical direction D1. The memory cells are connected to the word lines WL.

A plurality of string selection lines SSL1~SSL4 may be formed in an uppermost gate layer of the memory block MB1 (e.g., in each cell string), and a plurality of string selection transistors may be connected to the plurality of the string selection lines SSL1~SSL4, respectively, to control electric connections between the plurality of cell strings STR1~STR4 and a bit line BL.

A plurality of ground selection lines GSL1 and GSL2 may be formed in a lowest gate layer of the memory block MB1 (e.g., in each cell string), and a plurality of ground selection transistors may be connected to the plurality of the ground selection lines GSL1 and GSL2, respectively, to control electric connections between the plurality of cell strings STR1~STR4 and a source line CSL. Even though FIG. 7 illustrates that each ground selection line is assigned to two cell strings, example embodiments are not limited thereto.

A plurality of intermediate switching transistors MST1~MST4 may be disposed in the boundary portion BND between the sub blocks SB1 and SB2 to control electrical connections with memory cells of the plurality of cell strings STR1~STR4, as will be described below with reference to FIGS. 8A and 8B. The plurality of intermediate switching transistors MST1~MST4 are respectively connected to a plurality of intermediate switching lines MSL1~MSL4.

In some example embodiments, the cell strings STR1~STR4 connected to the same bit line BL may be divided into a plurality of cell string groups where each group of the cell string groups is electrically connected to the same bit line through each of string selection transistors. Each of the plurality of intermediate switching transistors may be independently activated by units of the cell string groups based on the program address during the program operation.

In some example embodiments, as illustrated in FIG. 7, the cell strings STR1~STR4 connected to the same bit line BL may be grouped one by one, and the intermediate switching transistors may be independently activated one by one. Such independent switching may be implemented by separating the gate line in the boundary portion BND into the intermediate switching lines MSL1~MSL4.

In some example embodiments, as will be described below with reference to FIGS. 17 and 18, each string group may include N cell strings connected to the same bit line where N is a natural number greater than 1, and the intermediate switching transistors corresponding to the same bit line may be independently activated N by N.

As described with reference to FIG. 3, the address decoder 430 may select one of the string selection lines SSL as a selected string selection line based on the row address R_ADDR provided from the control circuit 450. In the same way, the address decoder 430 may determine one of the plurality of intermediate switching lines MSL1~MSL4 as a selected intermediate switching line. The selected intermediate switching transistors connected to the selected intermediate switching line may be turned on independently or selectively by applying a turn-on voltage to the selected intermediate switching line and applying a turn-off voltage to the other unselected intermediate switching lines.

Figure 8A:
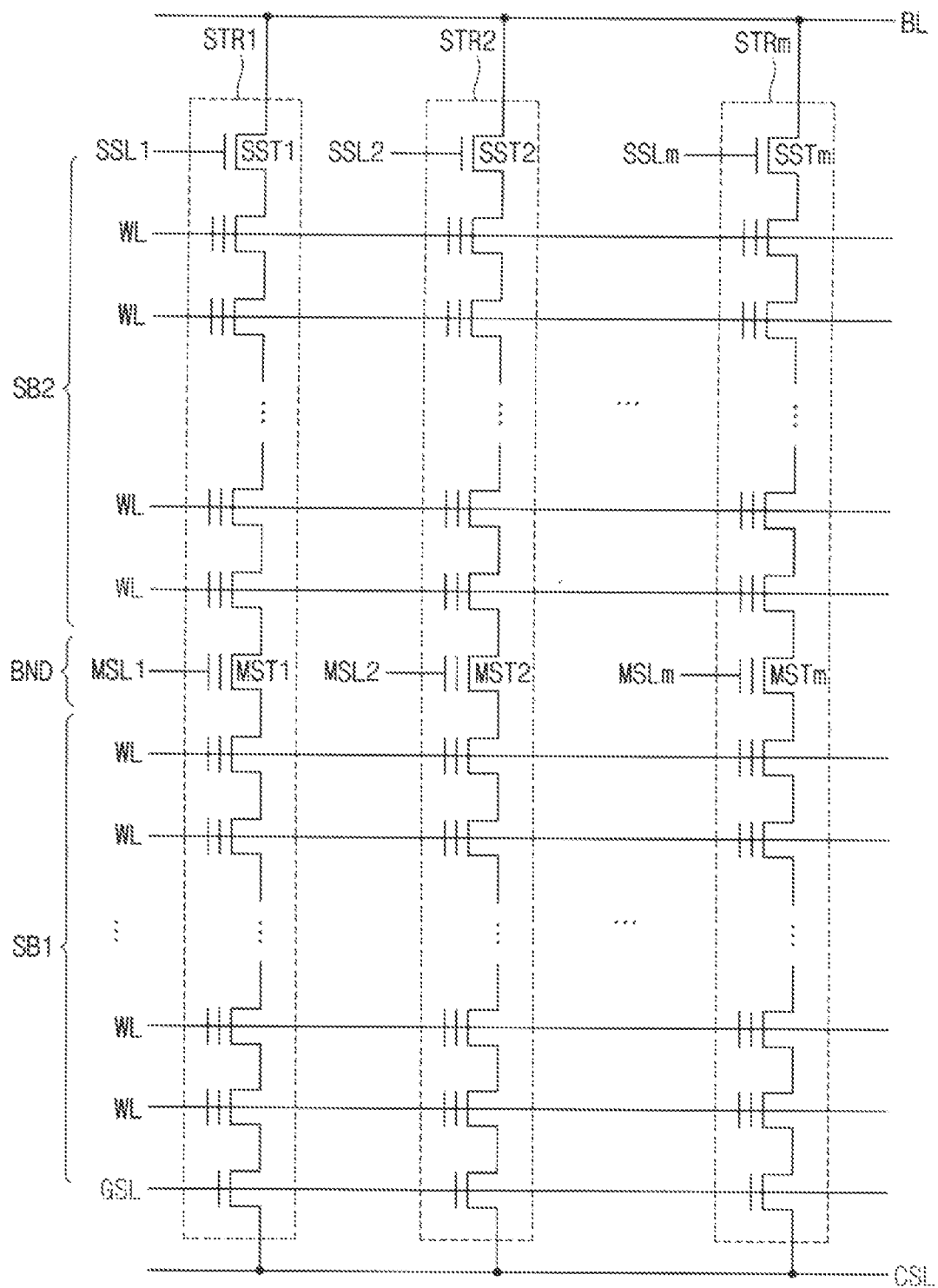
FIG. 8A is a circuit diagram illustrating an equivalent circuit corresponding to a structure of FIG. 7.
Figure 8B:
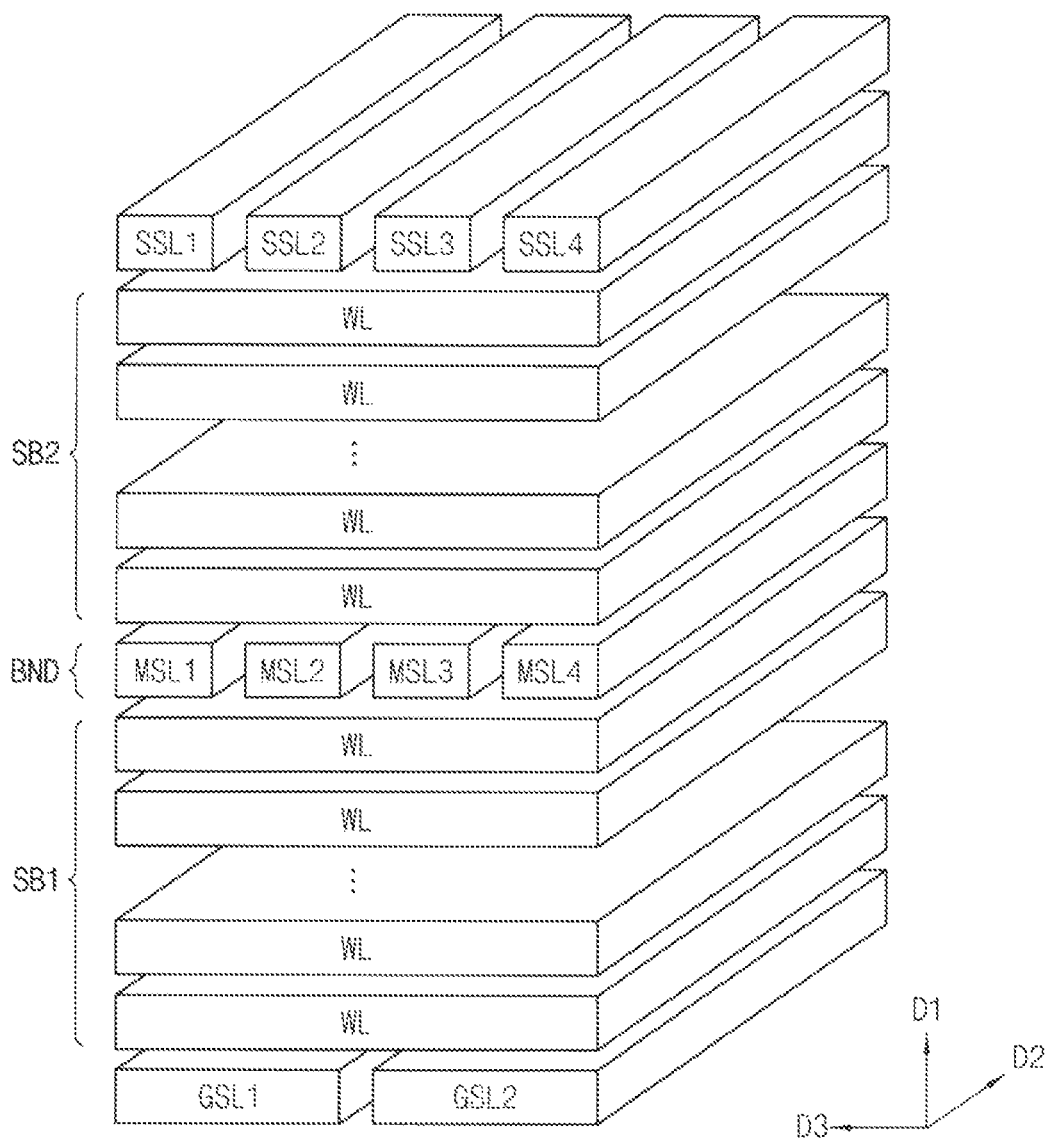
FIG. 8B is a perspective view illustrating a memory block corresponding to a structure of FIG. 7.

FIG. 8A is a circuit diagram illustrating an equivalent circuit corresponding to a structure of FIG. 7, and FIG. 8B is a perspective view illustrating a memory block corresponding to a structure of FIG. 7.

FIG. 8A illustrates two-dimensional version of a memory block including cell strings connected to one bit line BL and one source line CSL for convenience of illustration, but it will be understood that the memory block may have a three-dimensional structure of a plurality of bit lines as described with reference to FIGS. 5 and 6.

Referring to FIGS. 8A and 8B, a memory block may include a plurality of cell strings STR1~STRm connected between a bit line BL and a source line CSL. The cell strings STR1~STRm may include string selection transistors SST1~SSTm controlled by string selection lines SSL1~SSLm, memory cells controlled by word lines WL, intermediate switching transistors MST1~MSTm controlled by intermediate switching lines MSL1~MSLm and a ground selection transistors controlled by a ground selection line, respectively. Here, m is a natural number greater than 1. The memory cells connected to word lines disposed in edge portions of the sub blocks SB1 and SB2 may be dummy cells. Data may not be stored in the dummy cells or smaller data bits may be stored in each of the dummy cells different from the normal cells.

In example embodiments, each of the dummy cells may be implemented as a cell-type such as a flash memory cell including a floating gate, or a transistor-type (e.g., a normal transistor) without the floating gate. For example, if each of the dummy cells is a normal transistor, the dummy cell may not have stored data, and if each of the dummy cells is a cell-type transistor, some data may be stored in each of the dummy cells.

FIG. 8A illustrates an example embodiment that the ground selection transistors are connected to the same ground selection line GSL and FIG. 8B illustrates another example embodiment that the ground selection transistors are connected to the respective ground selection lines GSL1 and GSL2. However, example embodiments are not limited thereto.

As illustrated in FIGS. 8A and 8B, the intermediate switching transistors MST1~MSTm connected to the same bit line BL may be activated independently one by one by separating the gate line of the boundary portion BND into the intermediate switching lines MSL1~MSLm respectively corresponding to the cell strings STR1~STRm. The separated intermediate switching lines MSL1~MSLm may be extended along the second direction D2 and arranged along the third direction D3 as the string selection lines SSL~SSLm, as illustrated in FIG. 8B.

In example embodiments, each of the intermediate switching transistors MST1~MSTm may be implemented as a cell-type such as a flash memory cell including a floating gate, or a transistor-type (e.g., a normal transistor) without the floating gate. If the intermediate switching transistor is a cell-type transistor, a threshold voltage of the intermediate switching transistor may be changed by a program operation.

FIGS. 9A through 9D are cross-sectional views illustrating a memory block according to example embodiments.

Memory blocks in FIGS. 9A through 9D are similar to the memory block as described with reference to FIGS. 7, 8A and 8B, and the repeated descriptions may be omitted.

Figure 9A:
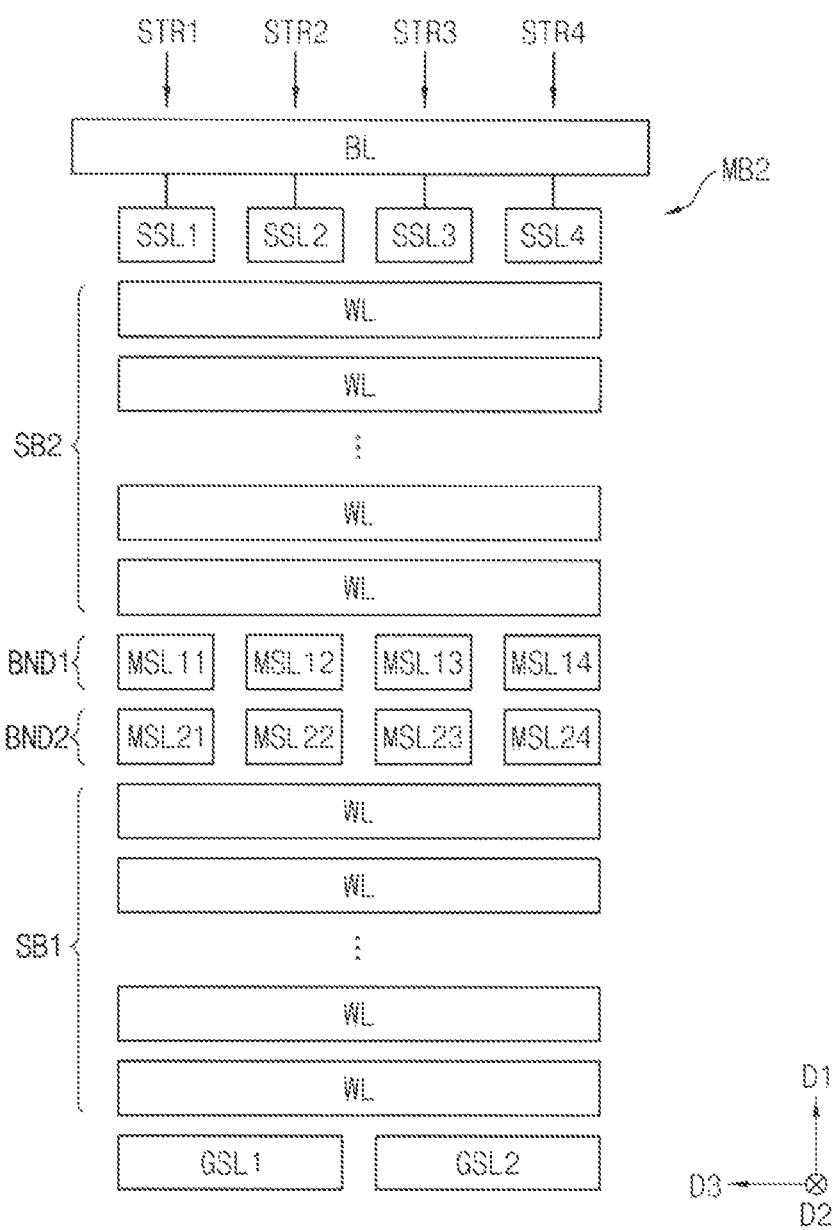
FIGS. 9A through 9D are cross-sectional views illustrating a memory block according to example embodiments.

Referring to FIG. 9A, a boundary portion of a memory block MB2 may include two or more gate layers that are adjacent to each other in the vertical direction D1. FIG. 9A illustrates two gate layers adjacent in the vertical direction D1, a first boundary portion BND1 and a second boundary portion BND2, but example embodiments are not limited thereto. The boundary portion dividing the sub blocks may include three or more gate layers adjacent in the vertical direction D1.

The first boundary portion BND1 may include a plurality of intermediate switching lines MSL11~MSL14 controlling the respective electric connections of the cell strings STR1~STR4 and the second boundary portion BND2 may include a plurality of intermediate switching lines MSL21~MSL24 controlling the respective electric connections of the cell strings STR1~STR4. The same driving voltage may be applied to the two intermediate switching lines MSL1$i$ and MSL2$i$ corresponding to the same cell string STR$i$.

As such, using the adjacent two or more gate lines as the boundary portion, with respect to each cell string, a lower string segment included in the first sub block SB1 may be electrically disconnected from an upper string segment included in the second sub block SB2, and thus the effect of the local boosting may be enhanced.

Figure 9B:
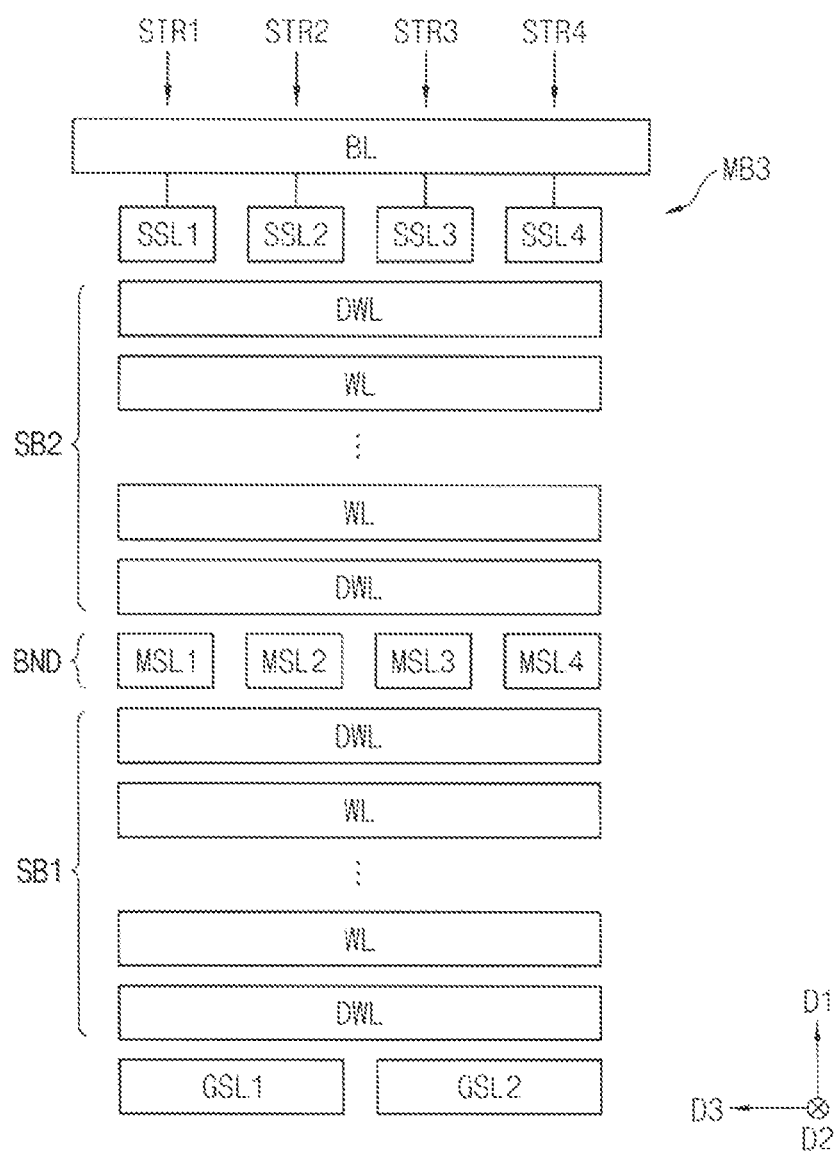

Referring to FIG. 9B, in a memory block MB3, at least one word line disposed in edge portions of the first sub block SB1 and the second sub block SB2 may be determined as a dummy word line DWL. The memory cells connected to the dummy word line DWL may be dummy cells in which data are not stored.

Dummy word lines DWL may be conductive lines formed adjacent to the plurality of word lines WL (e.g., normal gate lines). The dummy word lines DWL are patterned from the same conductive layers forming such normal gate lines. For example, dummy word lines DWL may be simultaneously formed with normal gate lines with the same processes that deposit and pattern the conductive layers forming normal gate lines.

Figure 9C:
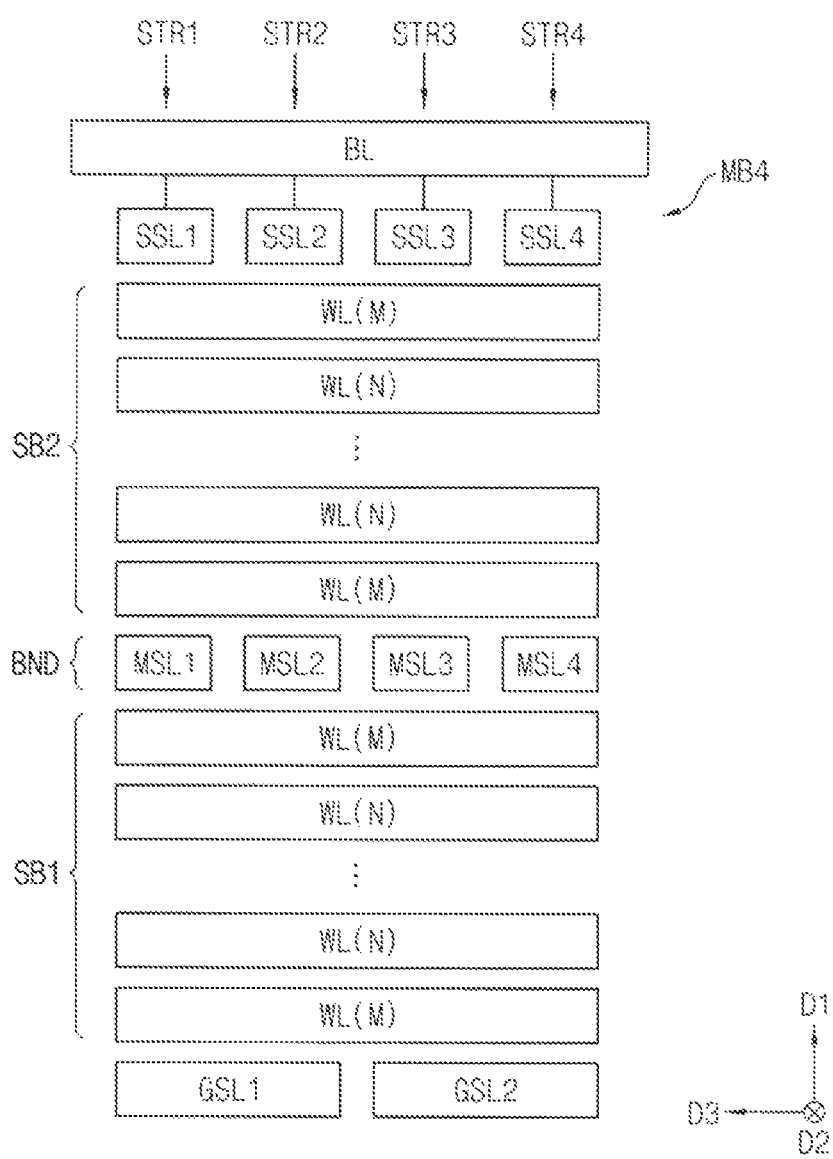

Referring to FIG. 9C, in a memory block MB4, M data bits may be stored in the memory cells connected to the word lines of edge portions and N data bits may be stored in the memory cells connected to the word lines of center portions of the sub blocks SB1 and SB2, where M is smaller than N. For example, the memory cells of the edge portions may be operated as a single level cell (SLC) and the memory cells of the center portions may be operated as a multiple level cell (MLC).

As described with reference to FIGS. 9B and 9C, the characteristic degradation of the memory cells according to the manufacturing process may be compensated by operating the memory cells as the dummy cells in which data are not stored or data of smaller bits are stored.

Figure 9D:
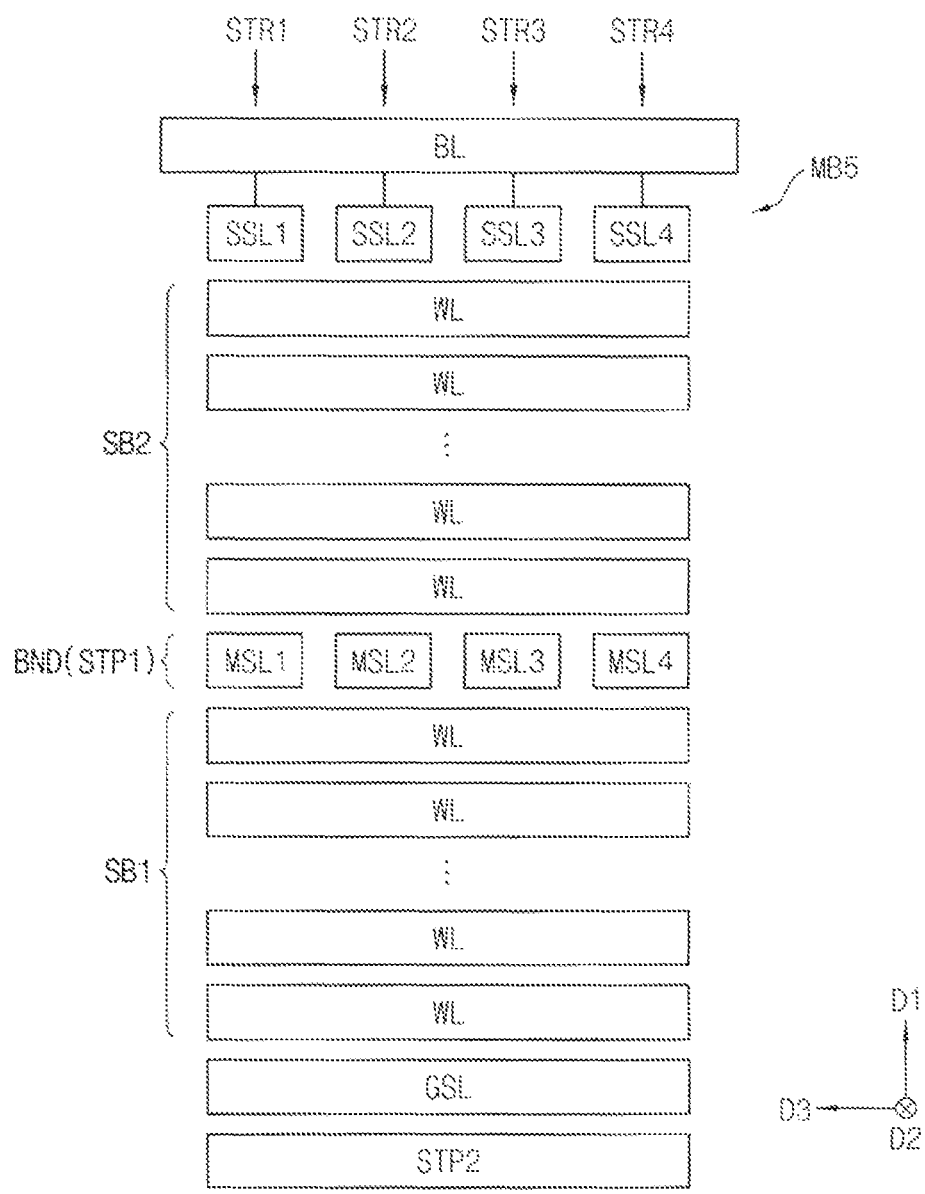

Referring to FIG. 9D, a memory block MB5 may include a first stopper layer STP1 disposed in a center portion and a second stopper layer STP2 disposed in the lowest portion in each cell string. For example, intermediate switching transistors in the second stopper layer STP2 may be simultaneously controlled by the same switching line. As will be described below with reference to FIG. 10, the first stopper layer STP1 may be used as the above-described boundary portion BND. With respect to the cell strings connected to the same bit line, the number of cell strings connected to the same ground selection line may be two as illustrated in FIG. 9A, four as illustrated in FIG. 9D, and so on.

As the number of the word lines increases, that is, as the number of the gate lines stacked in the vertical direction increases, a multiple stack structure may be adopted due to problems of manufacturing process. As an example, FIG. 10 illustrates a double stack structure.

Figure 10:
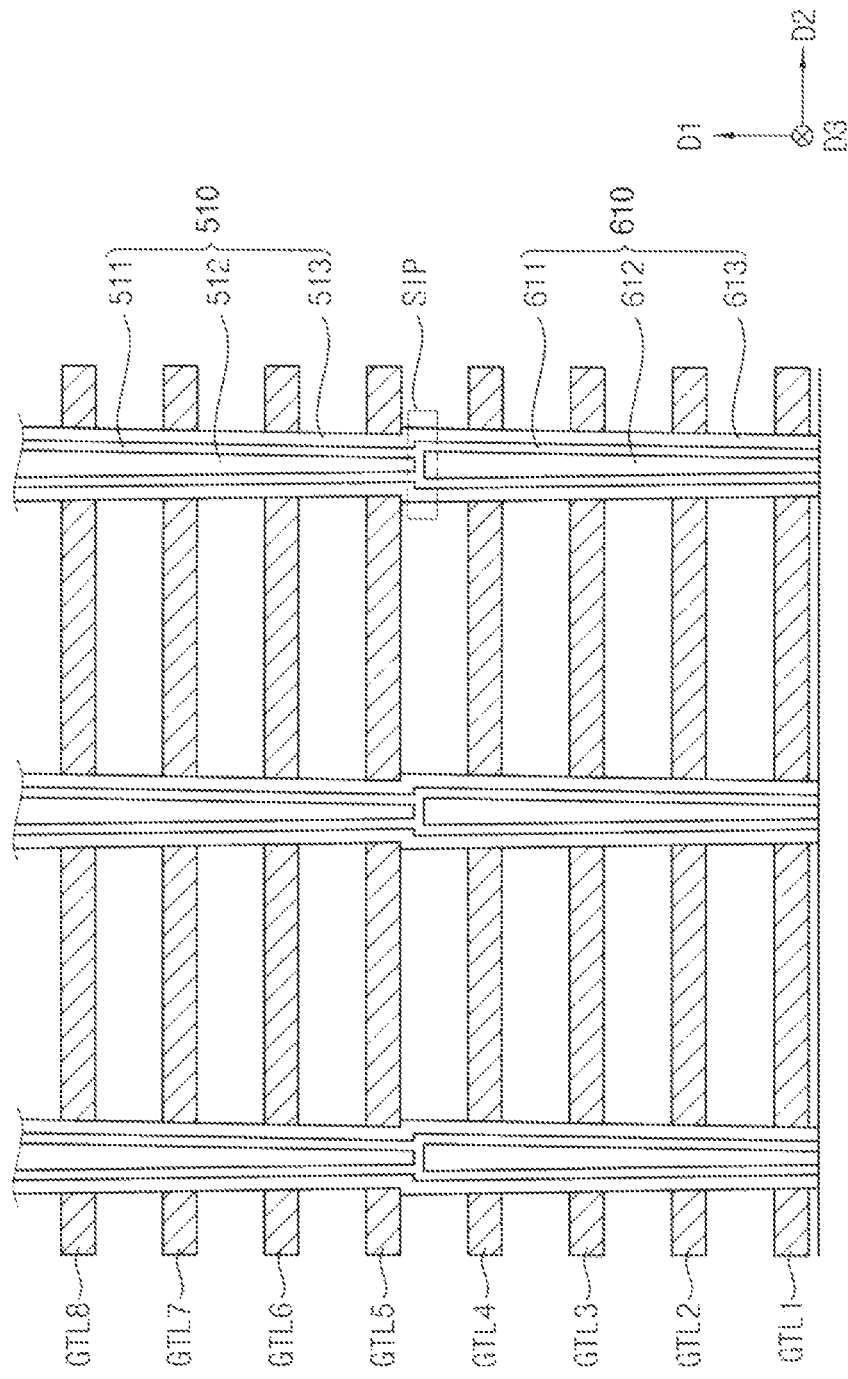
FIG. 10 is a cross-sectional view for describing an example embodiment of a boundary portion included in a memory block according to example embodiments.

FIG. 10 is a cross-sectional view for describing an example embodiment of a boundary portion included in a memory block according to example embodiments.

Referring to FIG. 10, a channel hole of each cell string STR may include a first sub channel hole 610 and a second sub channel hole 510. A channel hole may be referred to as a pillar. The first sub channel hole 610 may include a channel layer 611, an inner material 612 and an insulation layer 613. The second sub channel hole 510 may include a channel layer 511, an inner material 512 and an insulation layer 513. The channel layer 611 of the first channel hole 610 may be connected to the channel layer 511 of the second sub channel hole 510 through a P-type silicon pad SIP. The sub channel holes 610 and 510 may be formed using a stopper line GTL5 having an appropriate etch rate. For example, the stopper line GTL5 may be formed of polysilicon and the other gate lines GTL1~GTL4 and the GTL6~GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to from the intermediate switching transistors. Example embodiments are not limited to a boundary portion of one stopper layer, and the boundary portion may include two or more gate layers.

Figure 11:
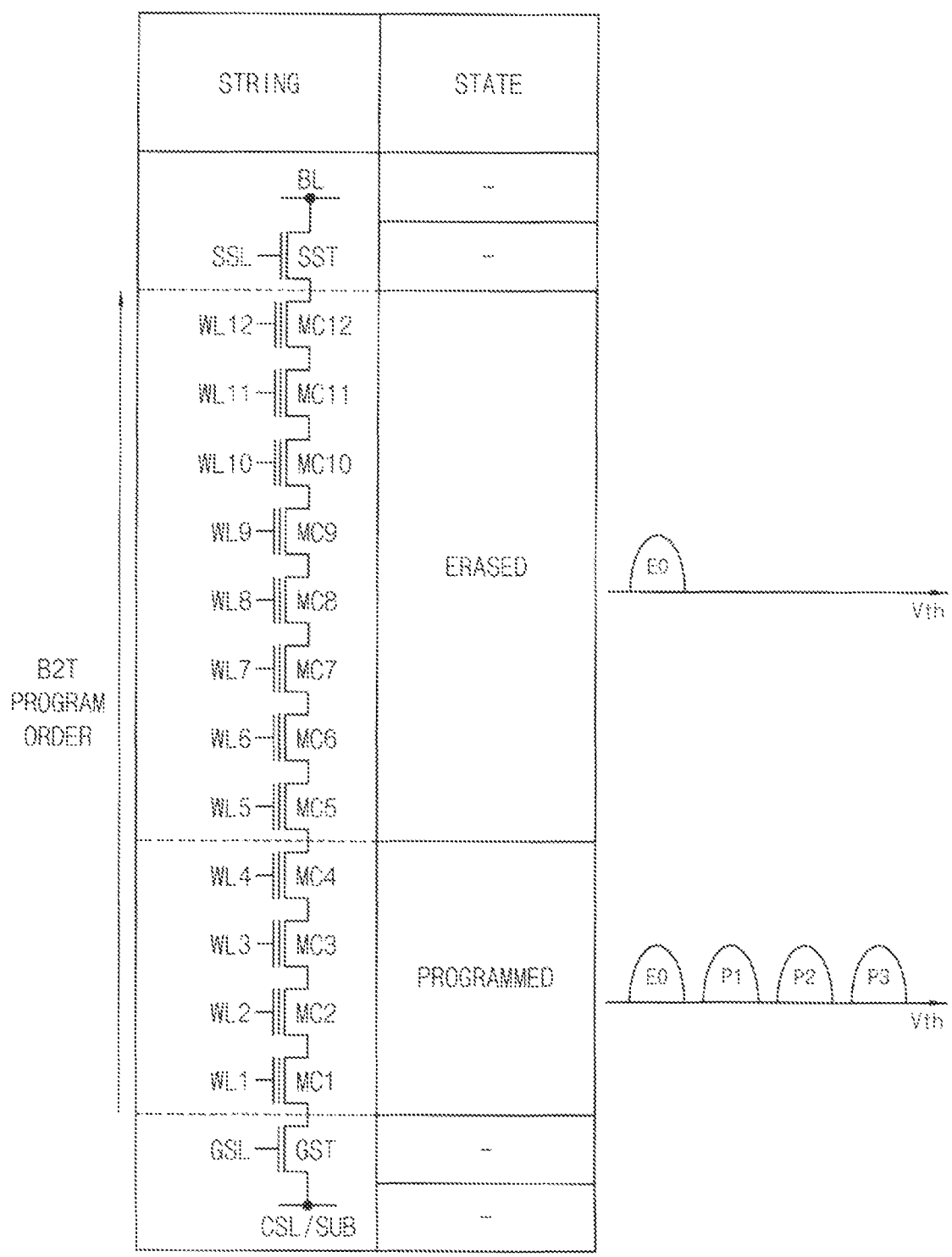
FIG. 11 is a diagram illustrating a first program scenario according to example embodiments.

FIG. 11 is a diagram illustrating a first program scenario according to example embodiments.

FIG. 11 illustrates one cell string STR including a string selection transistor SST connected to a string selection line SSL, a ground selection transistor GST connected to a ground selection line GSL and memory cells MC1~MC12 connected to word lines WL1~WL12 and states of memory cells. The cell string is connected between a bit line BL, a source line CSL and a substrate voltage SUB. FIG. 11 illustrates a non-limiting example of twelve memory cells and an MLC storing two bits.

Referring to FIG. 11, according to a first program scenario, the program operation may be performed in an upward direction from a lowest word line. In other words, as the data stored in the memory block increase, the data may be filled in erased cells in the upward direction from bottom to top (B2T program order). The not-programmed memory cells MC5~MC12 are in an erased state E0, and each of the programmed memory cells MC1~MC4 may be in one of the erased state E0 and programmed states P1, P2 and P3. For example, at least one of the memory cells MC2~MC11 may be an intermediate switching transistor.

Figure 12:
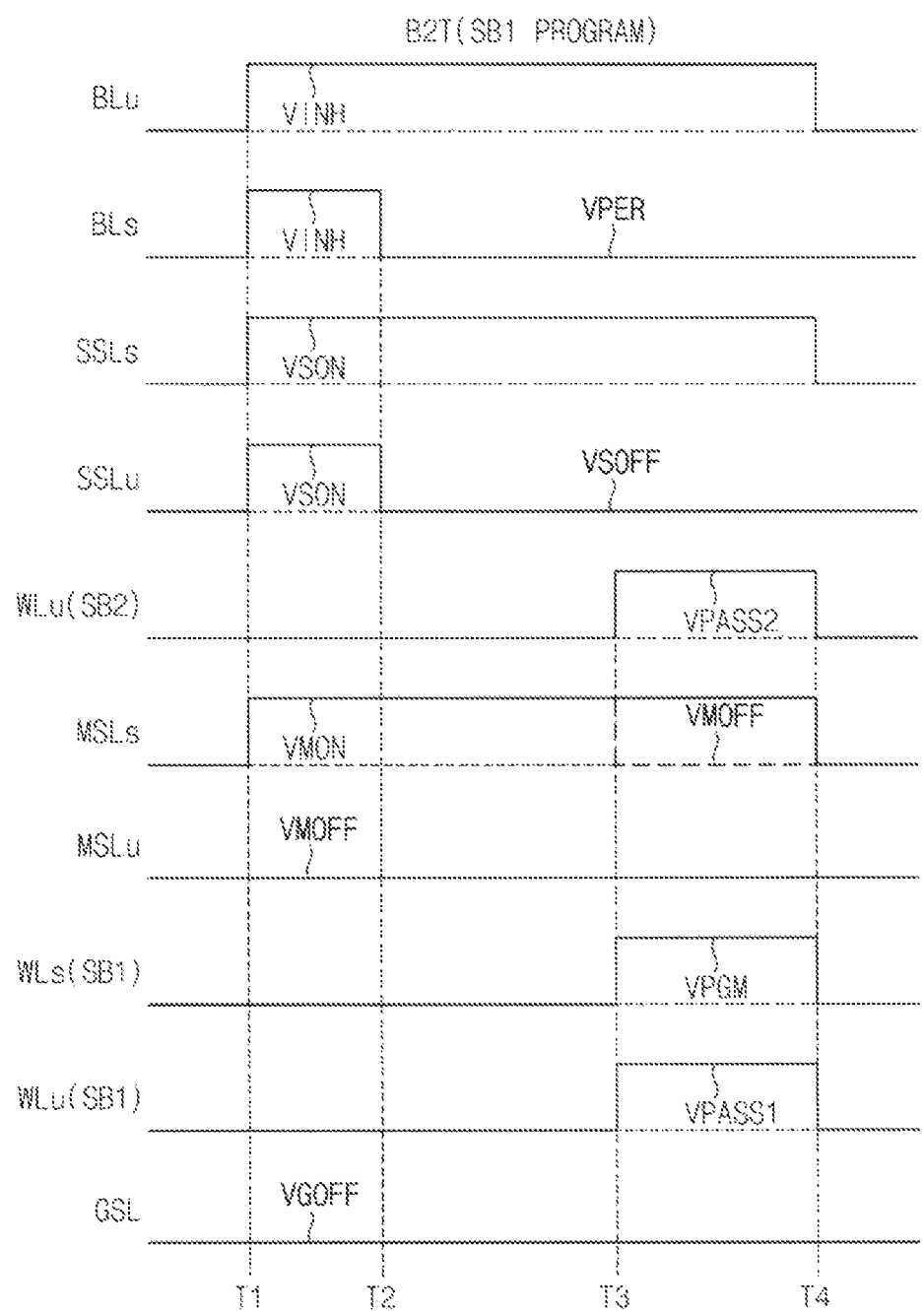
FIG. 12 is a timing diagram illustrating a program operation of a first sub block according to the first program scenario of FIG. 11.

FIG. 12 is a timing diagram illustrating a program operation of a first sub block according to the first program scenario of FIG. 11.

FIG. 12 illustrates a selective activating of intermediate switching transistors when a selected word line WLs corresponding to a program address is included in a first sub block SB1. Time interval T1~T2 is an initialization period and time interval T3~T4 is a program period while a program voltage VPGM is applied to the selected word line WLs.

Hereinafter, a turn-on voltage and a turn-off voltage represent voltage of levels to turn on and off a corresponding transistor. During the program operation, a turn-off voltage VGOFF may be applied to a ground selection line GSL and the cell string may be electrically disconnected from the source line CSL.

A program inhibition voltage VINH may be applied to an unselected bit line BLu. The program inhibition voltage VINH may be applied during the initialization period T1~T2 and then a program permission voltage VPER may be applied to a selected bit line BLs.

A turn-on voltage VSON may be applied to a selected string selection line SSLs. The turn-on voltage VSON may be applied during the initialization period T1~T2 and then a turn-off voltage VSOFF may be applied to an unselected string selection line SSLu. According to the turn-on voltage VSON or the turn-off voltage VSOFF, each string selection transistor may be activated selectively and the electrical connection between the bit line and the cell string STR may be controlled.

Accordingly the cell string may be electrically connected to the bit line BL during the program interval T3~T4, and the channel of the cell string may receive the program inhibition voltage VINH or the program permission voltage VPER depending on a data bit to be programmed. The unselected cell string STR may be electrically disconnected from the bit line BL and the source line CSL and thus floated.

During the program interval T3~T4, a program voltage VPGM may be applied to a selected word line WLs of the first sub block SB1 and a first pass voltage VPASS1 may be applied to an unselected word line WLu of the first sub block SB1. The first pass voltage VPASS1 has a level capable of turning on a memory cell that has a highest threshold voltage distribution.

During the program interval T3~T4, a second pass voltage VPASS2 lower than the first pass voltage VPASS1 may be applied to an unselected word line of the second sub block SB2. According to the first program scenario, all of the memory cells of the second sub block SB2 are in the erased state E0. Accordingly it is sufficient for the second pass voltage VPASS2 to have a level capable of turning on the memory cell of the erased state E0. As such, using the second pass voltage VPASS2 lower than the first pass voltage VPASS1, the pass voltage disturbance on the memory cells of the second sub block SB2 may be reduced.

A turn-on voltage VMON may be applied to a selected intermediate switching line MSLs corresponding to the program address and a turn-off voltage VMOFF may be applied to the unselected intermediate switching lines MSLu except the selected intermediate switching line. As a result, during the program operation of the first sub block SB1, the selected intermediate switching transistor connected to the selected intermediate switching line MSLs may be turned on and the unselected intermediate switching transistor connected to the unselected intermediate switching line MSLu may be turned off.

As such, the local boosting may be implemented through the selective switching of the intermediate switching transistors based on the program address. In case of programming the word line of the first sub block SB1, at time point T3 when the program voltage VPGM and the first pass voltage VPASS1 are applied to the word lines of the first sub block SB1, the channel of the unselected cell string may be boosted together and thus the stress on the memory cells irrelevant to programming may be reduced. The lower string segment of the unselected cell string may be electrically disconnected from the upper string segment of the unselected cell string by turning off the unselected intermediate switching transistor, and thus the local boosting of the lower string segment may be implemented. Through the local boosting, the program voltage disturbance and the pass voltage disturbance of the unselected cell string may be reduced.

Figure 13:
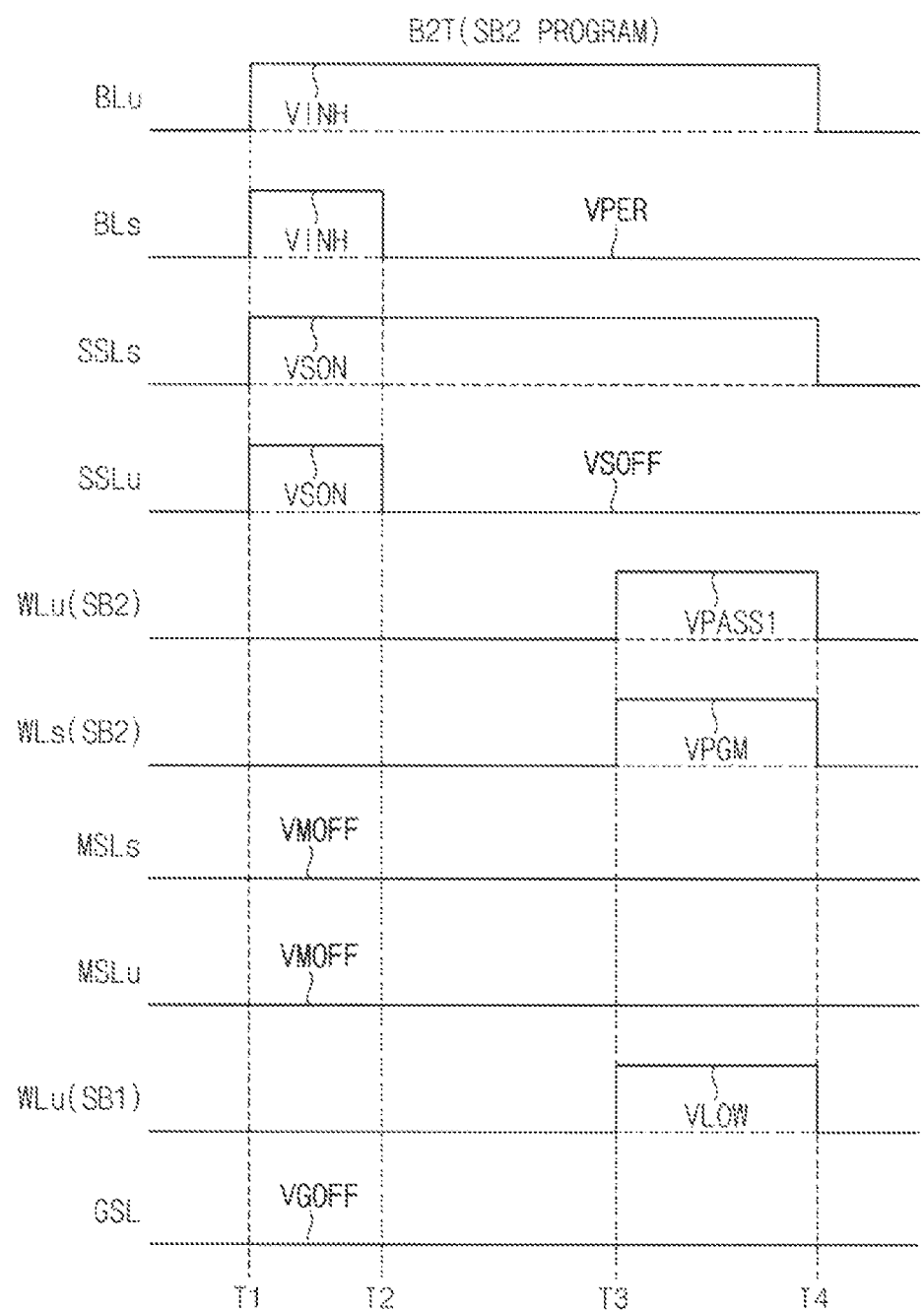
FIG. 13 is a timing diagram illustrating a program operation of a second sub block according to the first program scenario of FIG. 11.

FIG. 13 is a timing diagram illustrating a program operation of a second sub block according to the first program scenario of FIG. 11. The descriptions repeated with FIG. 12 may be omitted.

Referring to FIG. 13, when the selected word line WLs corresponding to the program address is included in the second sub block SB2, the first pass voltage VPASS1 may be applied to the unselected word lines WLu of the second sub block SB2 during the program interval T3~T4. The unselected word lines WLu included in the first sub block SB1 may be floated or a low voltage VLOW lower than the first pass voltage VPASS1 may be applied to the unselected word lines WLu included in the first sub block SB1 during the program period T3~T4. The low voltage VLOW is for removing uncertainty when the unselected word lines WLu in the first sub block SB1 are floated, and the low voltage VLOW may be lower than the second pass voltage VPASS2 in FIG. 12. For example, when the low voltage VLOW is applied to the unselected word lines WLu included in the first sub block SB1, the memory cells connected to the unselected word lines WLu included in the first sub block SB1 may be in a turned off state. In some examples, the first pass voltage VPASS1 may be applied to the unselected word lines WLu in the first sub block SB1 during the program interval T3~T4.

When the selected word line WLs corresponding to the program address is included in the second sub block SB2, the turn-off voltage VMOFF may be applied to the selected intermediate switching line MSLs and the unselected intermediate switching line MSLu regardless of the program address. Accordingly all of the intermediate switching transistors may be turned off during the program operation regardless of the program address.

As such, the local boosting may be implemented through the selective switching of the intermediate switching transistors based on the program address. In case of programming the word line of the second sub block SB2, at time point T3 when the program voltage VPGM and the first pass voltage VPASS1 are applied to the word lines of the second sub block SB2, the channel of the unselected cell string may be boosted together and thus the stress on the memory cells irrelevant to programming may be reduced. With respect to the selected cell string and the unselected cell string, the upper string segment may be electrically disconnected from the lower string segment by turning off the selected and unselected intermediate switching transistors, and thus the local boosting of the upper string segment may be implemented. Through the local boosting, the program voltage disturbance and the pass voltage disturbance may be reduced.

Figure 14:
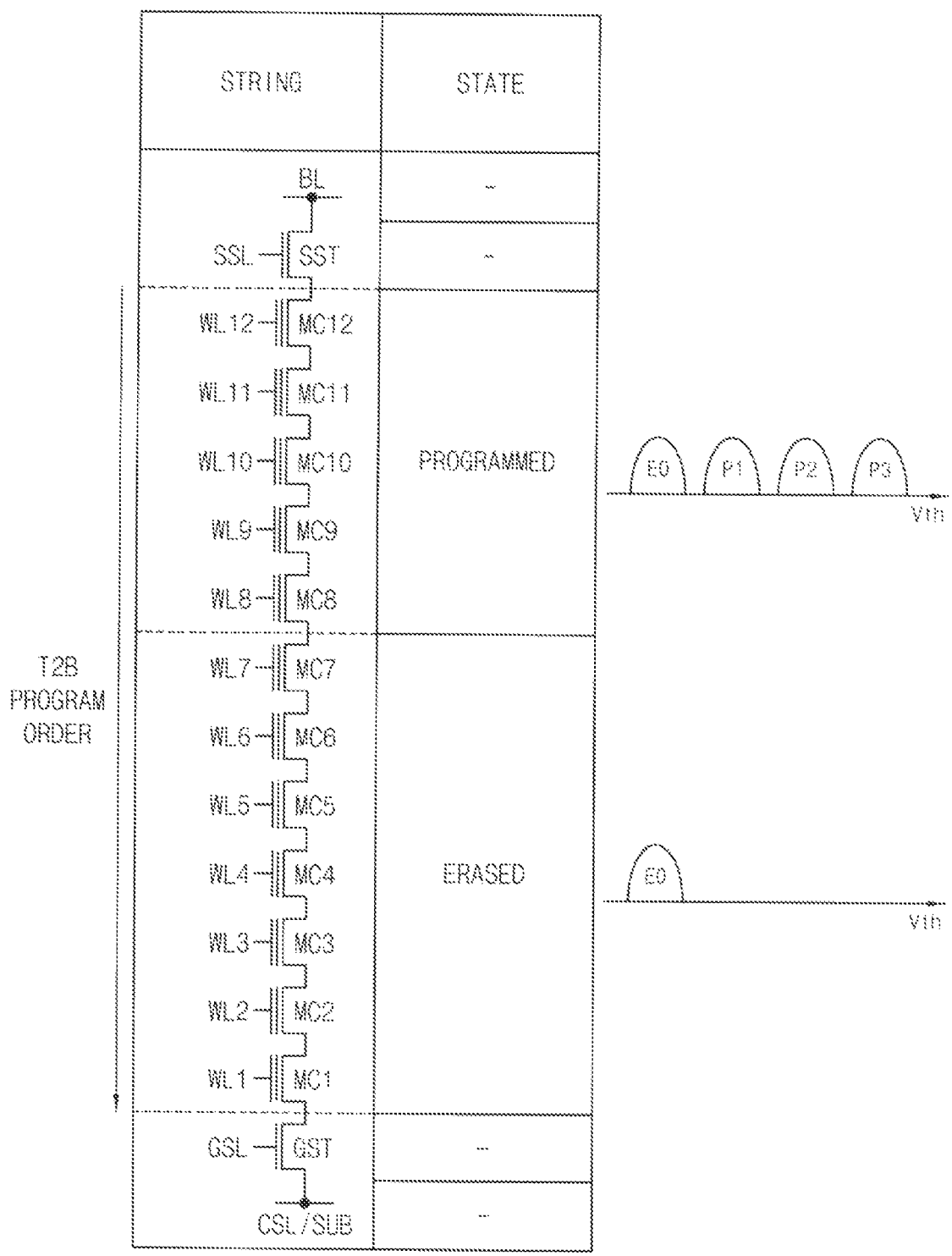
FIG. 14 is a diagram illustrating a second program scenario according to example embodiments.

FIG. 14 is a diagram illustrating a second program scenario according to example embodiments. The descriptions repeated with FIG. 11 may be omitted.

Referring to FIG. 14, according to a second program scenario, the program operation may be performed in a downward direction from an uppermost word line. In other words, as the data stored in the memory block increase, the data may be filled in erased cells in the downward direction from top to bottom (T2B program order). The not-programmed memory cells MC1~MC7 are in an erased state E0, and each of the programmed memory cells MC8~MC12 may be in one of the erased state E0 and programmed states P1, P2 and P3. For example, at least one of the memory cells MC2~MC11 may be an intermediate switching transistor.

Figure 15:
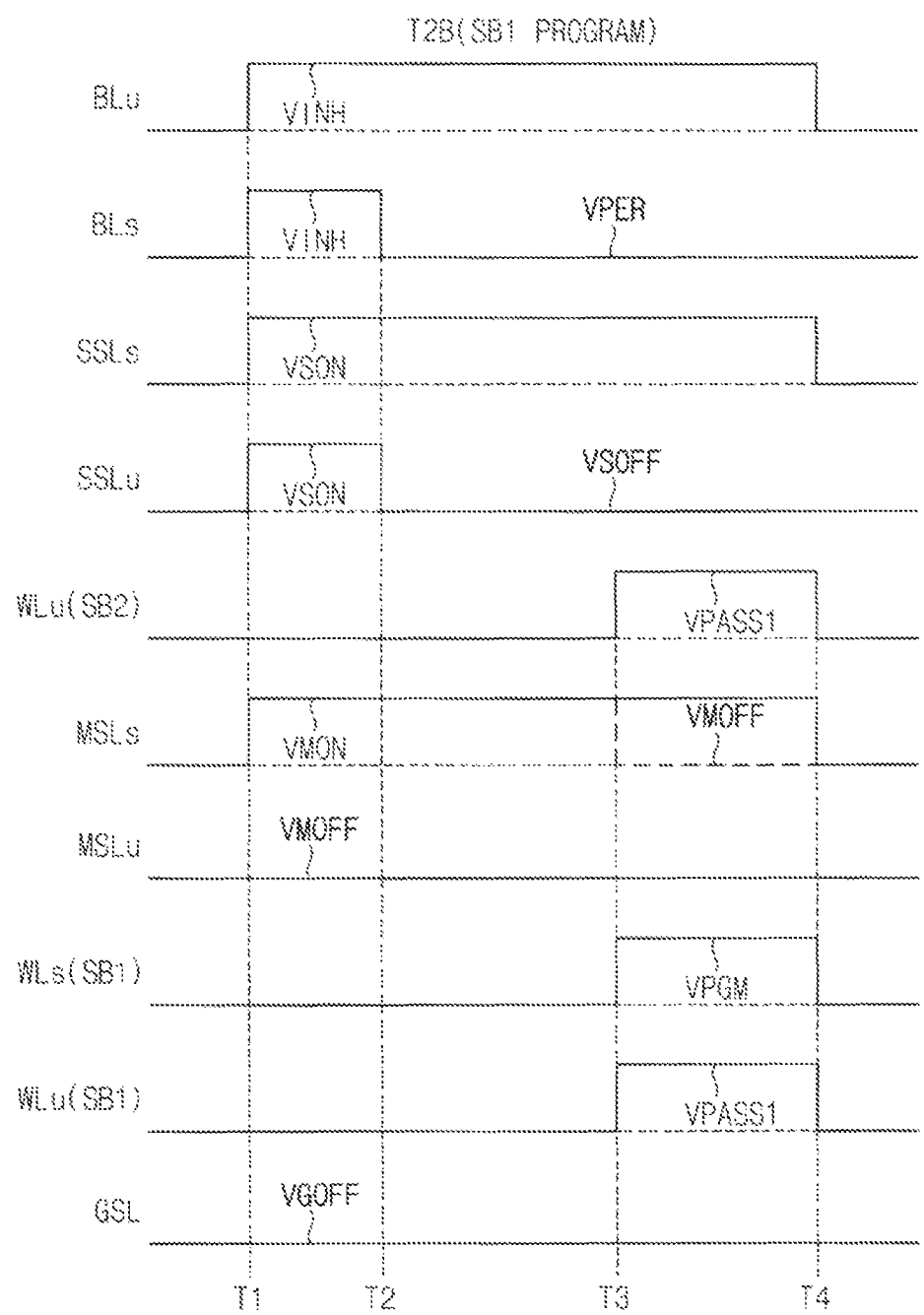
FIG. 15 is a timing diagram illustrating a program operation of a first sub block according to the second program scenario of FIG. 14.
Figure 16:
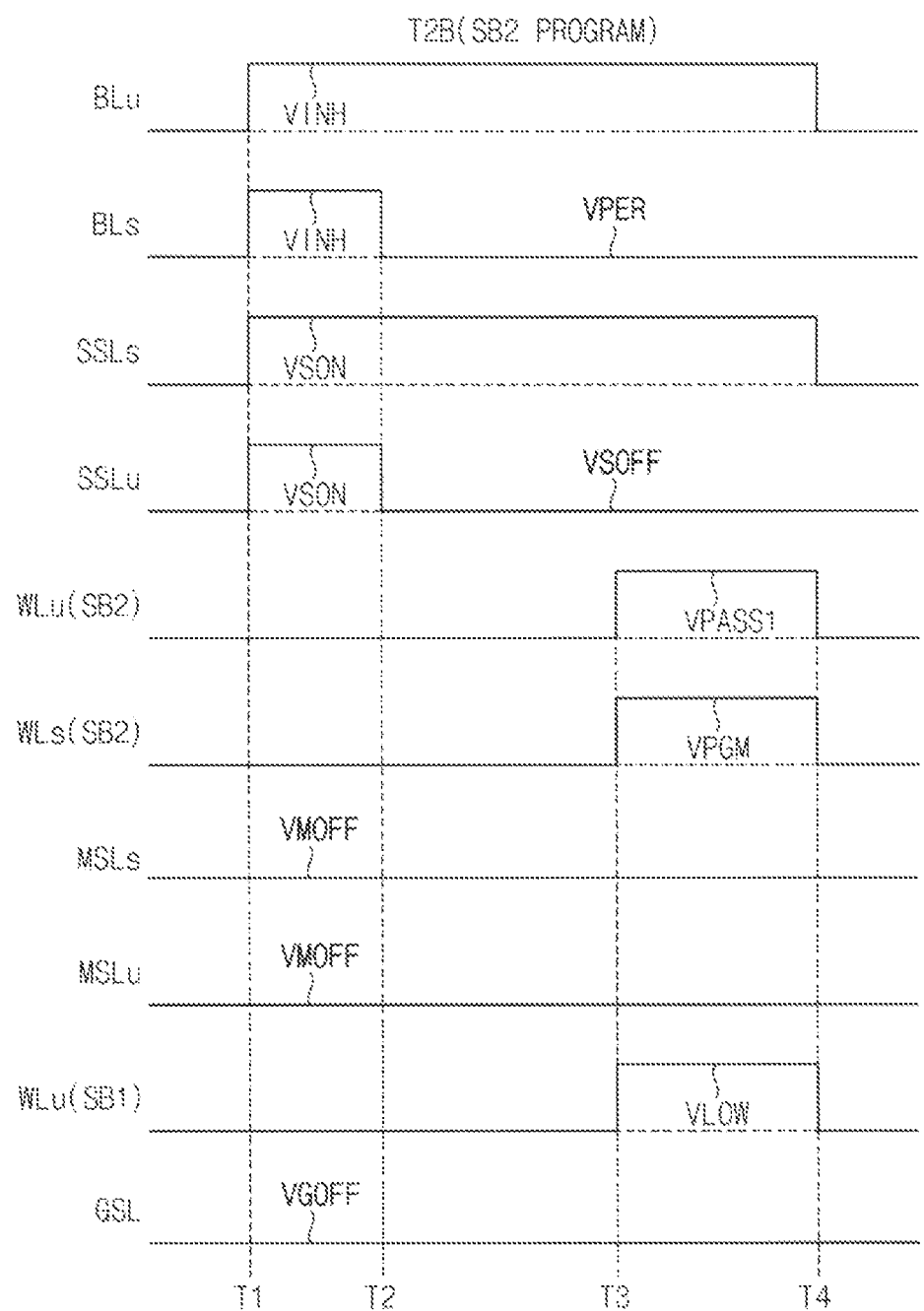
FIG. 16 is a timing diagram illustrating a program operation of a second sub block according to the second program scenario of FIG. 15.

FIG. 15 is a timing diagram illustrating a program operation of a first sub block according to the second program scenario of FIG. 14, and FIG. 16 is a timing diagram illustrating a program operation of a second sub block according to the second program scenario of FIG. 15.

The selective switching by the selected intermediate switching line MSLs and the unselected intermediate switching line MSLu of FIGS. 15 and 16 according to the second program scenario is the same as that of FIGS. 12 and 13 according to the first program scenario. The descriptions repeated with FIGS. 12 and 13 may be omitted.

Referring to FIG. 15, when the selected word line WLs corresponding to the program address is included in the first sub block SB1.

The same pass voltage VPASS1 may be applied to the unselected word lines WLu included in the first sub block SB1 and the unselected word lines WLu in the second sub block SB during the program period T3~T4.

Referring to FIG. 16, when the selected word line WLs corresponding to the program address is included in the second sub block SB2, the first pass voltage VPASS1 may be applied to the unselected word lines WLu included in the second sub block SB2 during the program period T3~T4. In contrast, the unselected word lines included in the first sub block SB1 may be floated or the low voltage VLOW lower than the first pass voltage VPASS1 may be applied to the unselected word lines included in the first sub block SB1 during the program period T3~T4. For example, when the low voltage VLOW is applied to the unselected word lines WLu included in the first sub block SB1, the memory cells connected to the unselected word lines WLu included in the first sub block SB1 may be in a turned off state.

Figure 17:
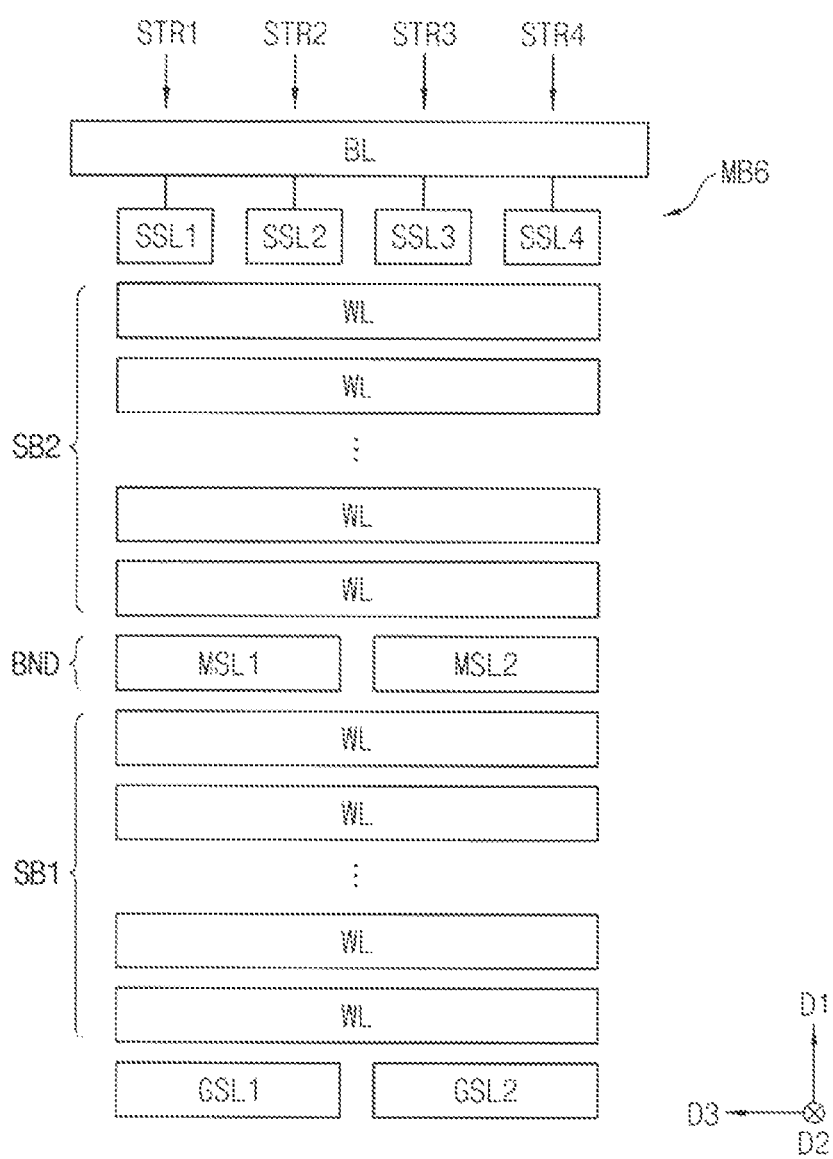
FIGS. 17 and 18 are cross-sectional views illustrating a memory block according to example embodiments.
Figure 18:
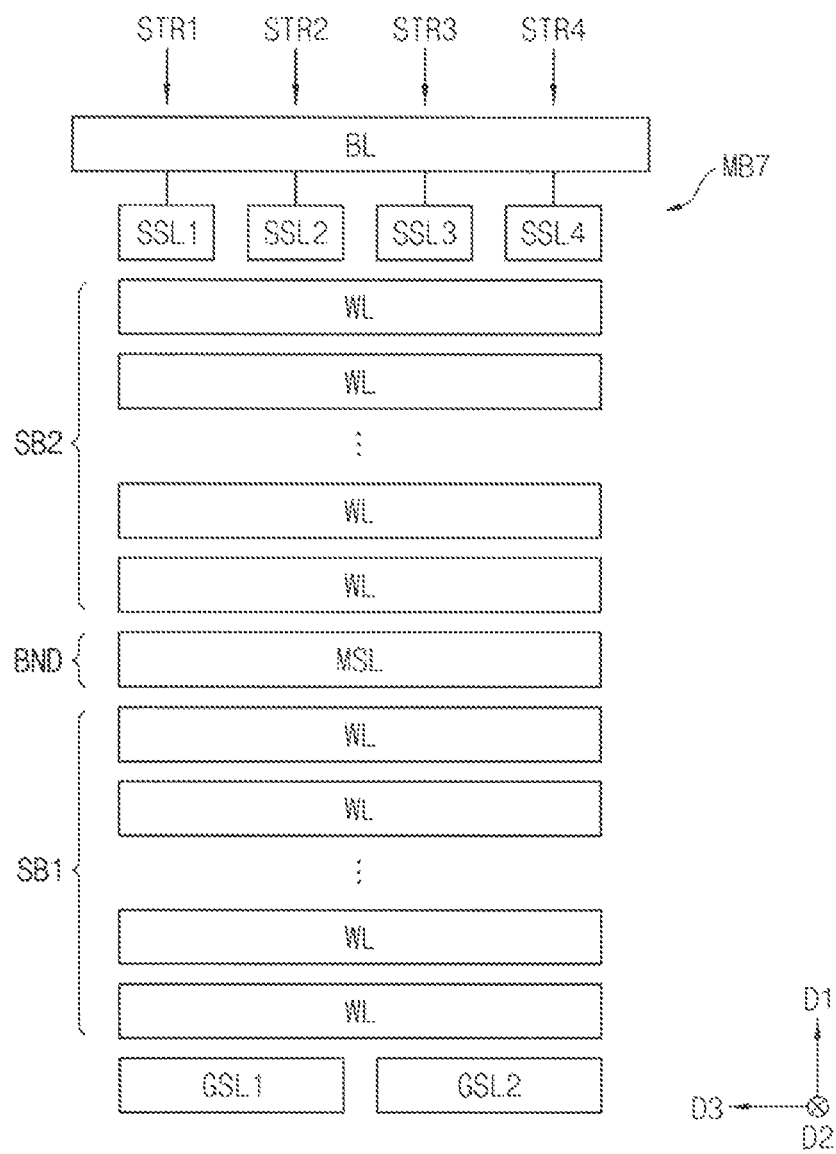

FIGS. 17 and 18 are cross-sectional views illustrating a memory block according to example embodiments.

As described with reference to FIG. 7, the cell strings STR1~STR4 connected to the same bit line BL may be grouped into a plurality of cell string groups, where each of the cell strings is electrically connected to the same bit line through each of string selection transistors. The intermediate switching transistors may be independently activated by units of string groups. The descriptions repeated with FIG. 7 may be omitted.

In a memory block MB6 of FIG. 17, the cell strings STR1~STR4 connected to the same bit line BL may be grouped two by two, and the intermediate switching transistors connected to the intermediate switching lines MSL1 and MSL2 may be independently activated two by two based on the program address. In contrast, a memory block MB7 of FIG. 18, the cell strings STR1~STR4 connected to the same bit line BL may be grouped four by four, and the intermediate switching transistors connected to the intermediate switching lines MSL may be independently activated four by four based on the program address.

Hereinafter, example embodiments of a memory block including three sub blocks will be described with reference to FIGS. 19 through 25. The descriptions repeated with the example embodiment of the memory block including the two sub blocks may be omitted.

Figure 19:
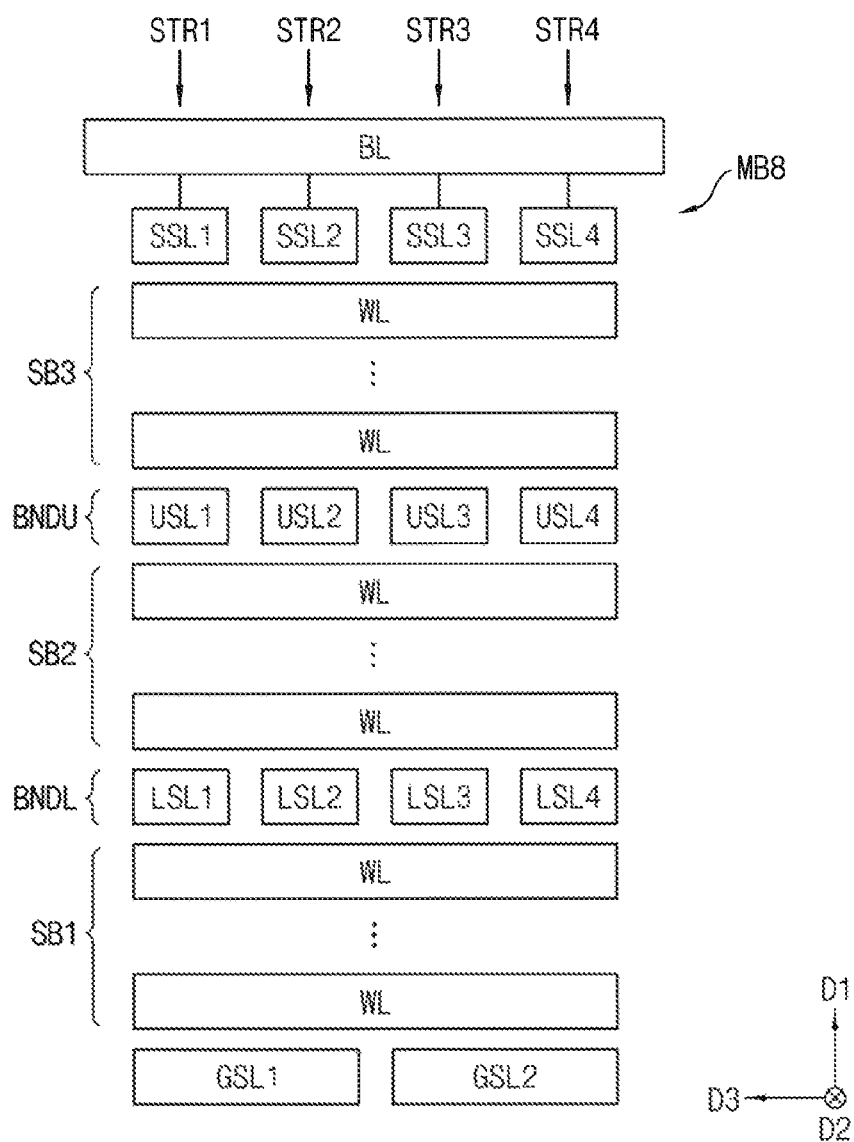
FIG. 19 is a cross-sectional view illustrating a memory block divided into three sub blocks according to example embodiments.

FIG. 19 is a cross-sectional view illustrating a memory block divided into three sub blocks according to example embodiments.

Referring to FIG. 19, the above-described boundary portion BND may include a lower boundary portion BNDL and an upper boundary portion BNDU. A memory block MB8 may include a first sub block SB1 below the lower boundary portion BNDL, a second sub block SB2 between the lower boundary portion BNDL and the upper boundary portion BNDU and a third sub block SB3 above the upper boundary portion BNDU.

The above-described intermediate switching transistors may include a plurality of lower switching transistors disposed in the lower boundary portion BNDL and connected to the lower switching lines LSL1~LSL4 and a plurality of upper switching transistors disposed in the upper boundary portion BNDU and connected to the upper switching lines USL1~USL4.

FIGS. 20 through 22 are diagrams illustrating program operations of sub blocks in FIG. 19 according to the first program scenario of FIG. 11. FIGS. 23 through 25 are diagrams illustrating program operations of sub blocks in FIG. 19 according to the second program scenario of FIG. 14.

FIGS. 20 through 25 illustrate driving voltages of gate lines SSL, WLu, WLs, USL, LSL and GSL with respect to a case of a selected cell string and a case of an unselected cell string. Hereinafter, the descriptions repeated with the first program order B2T of FIGS. 11, 12 and 13 and the second program order T2B of FIGS. 14, 15 and 16 may be omitted. The voltages VPGM, VPASS1, VPASS2 and VLOW applied to the selected word line WLs and the unselected word line WLu and the voltages VSON, VSOFF, VGON and VGOFF applied to the selection lines SSL and GSL are the same as the descriptions of FIGS. 11 through 16.

During the program operation, the program inhibition voltage VINH or the program permission voltage VPER may be applied to the bit line BL depending on the data bit to be programmed. For example, a ground voltage GND may be applied to the source line CSL.

FIGS. 20 through 25 illustrate a non-limiting example that the lower switching transistor corresponds to the fourth memory cell MC4 and the upper switching transistor corresponds to the eighth memory cell MC8 for convenience of illustration, and example embodiments are not limited thereto. The switching operation of the lower switching transistor MC4 may be controlled by the lower switching line LSL and switching operation of the upper switching transistor MC8 may be controlled by the upper switching line USL.

Referring to FIGS. 20 and 23, when the selected word line WLs corresponding to the program address is included in the first sub block SB1, the selected lower switching transistors and the selected upper switching transistors corresponding to the program address may be turned on. In contrast, the unselected lower switching transistors except the selected lower switching transistors and unselected upper switching transistors except the selected upper switching transistors may be turned off.

Referring to FIGS. 21 and 24, when the selected word line WLs corresponding to the program address is included in the second sub block SB2, the selected upper switching transistors corresponding to the program address may be turned on. In contrast, the selected lower switching transistors corresponding to the program address, the unselected lower switching transistors except the selected lower switching transistors and unselected upper switching transistors except the selected upper switching transistors may be turned off.

Referring to FIGS. 22 and 25, when the selected word line WLs corresponding to the program address is included in the third sub block SB3, the plurality of lower switching transistors and the plurality of upper switching transistors may be turned off regardless of the program address.

As such, the nonvolatile memory device and the method of programming in the nonvolatile memory device according to example embodiments may reduce program voltage disturbance and pass voltage disturbance and thus increase performance and lifetime of the nonvolatile memory device through independent switching of the intermediate switching transistors to implement local boosting of string segments irrelevant to programming.

Figure 26:
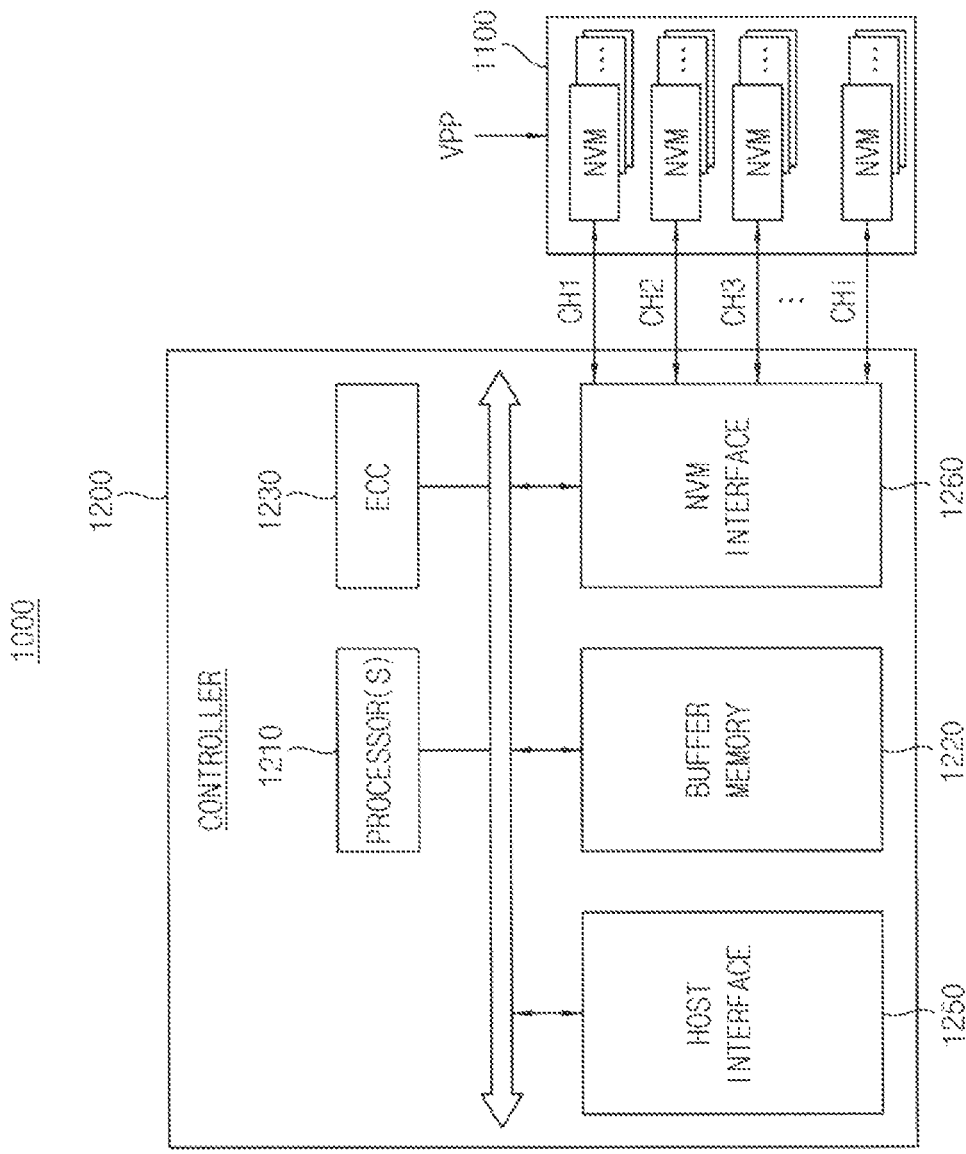
FIG. 26 is a block diagram illustrating a solid state disk or solid state drive (SSD) according to example embodiments.

FIG. 26 is a block diagram illustrating a solid state disk or solid state drive (SSD) according to example embodiments.

Referring to FIG. 26, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described memory devices disclosed above. The nonvolatile memory devices 1100 may include the intermediate switching transistors to implementing the local boosting of the string segment by selectively activating each of the intermediate switching transistors based on the program address.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

Figure 27:
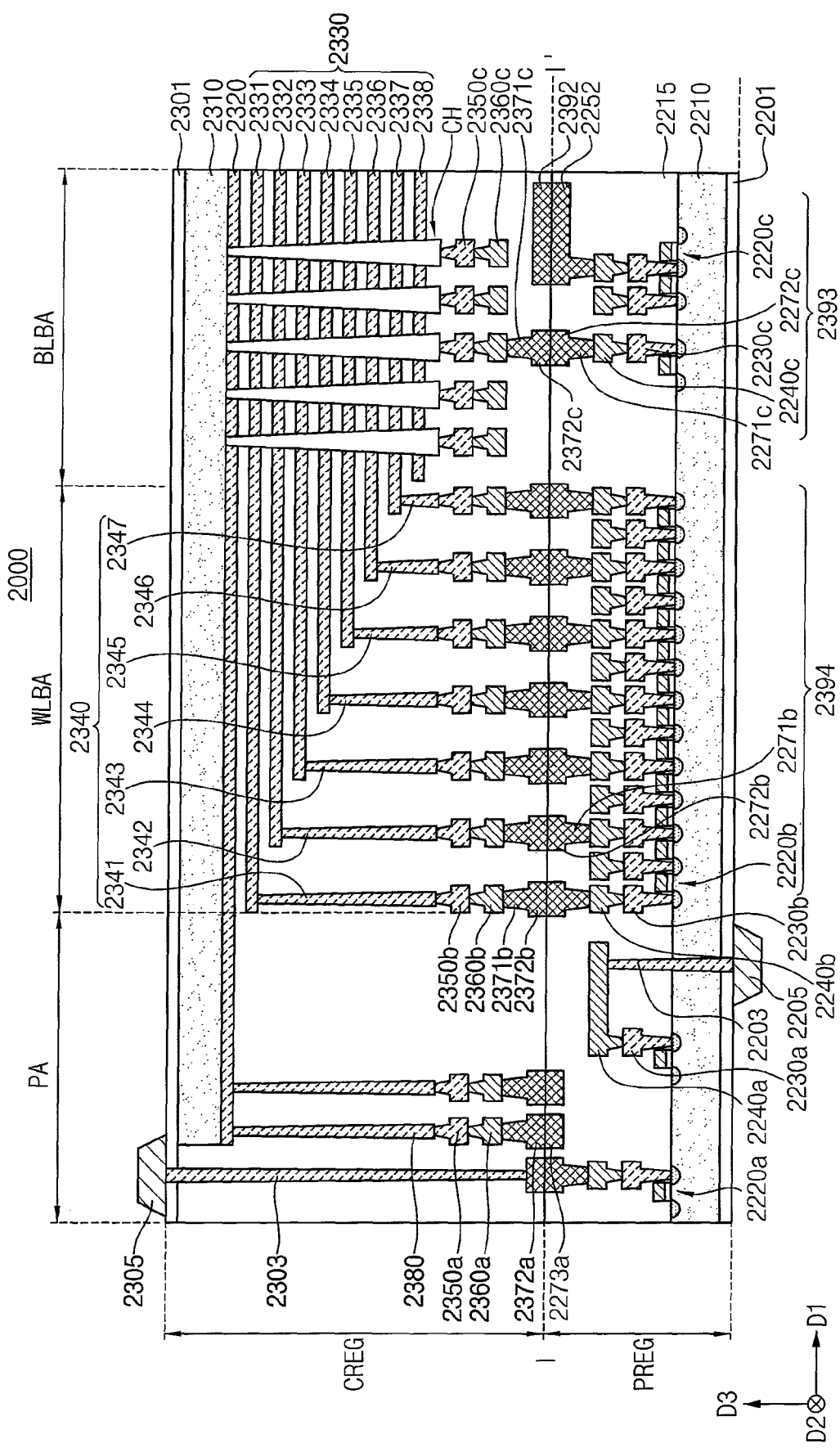
FIG. 27 is a cross-sectional diagram illustrating a nonvolatile memory device according to example embodiments.

FIG. 27 is a cross-sectional diagram illustrating a nonvolatile memory device according to example embodiments.

Referring to FIG. 27, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface I-I'. In this regard, a bonding process or a bonding manner may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In some embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some embodiments, such as the embodiment of FIG. 27, although only the first metal layers 2230a, 2230b, and 2230c and the second metal layers 2240a, 2240b, and 2240c are shown and described, example embodiments are not limited thereto. For example, in some embodiments, one or more additional metal layers may be further formed on the second metal layers 2240a, 2240b, and 2240c. At least a portion of the one or more additional metal layers formed on the second metal layers 2240a, 2240b, and 2240c may be formed of, for example, aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG by a bonding manner. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred as first metal pads, and the lower bonding metals 2271b and 2272b in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In an example embodiment, the bitline (the second metal layer 2360c) may extend in a second horizontal direction D2 (e.g., a Y-axis direction) parallel to the upper surface of the second substrate 2310.

In the illustrated example of FIG. 27, an area in which the channel structure CH, the bitline (the second metal layer 2360c), and the like are disposed may be defined as the bitline bonding area BLBA. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 is electrically connected to a circuit element 2220a.

In some embodiments, the second substrate 2310 and the common source line 2320 are not disposed in an area in which the second I/O contact plug 2303 is disposed. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310, and may pass through the interlayer insulating layer 2315 of the cell region CREG to be connected to the second I/O pad 2305.

According to embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. Alternatively, in some embodiments, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In some embodiments, in the peripheral region PREG, the lower metal pattern 2273a formed in the uppermost metal layer of the peripheral region PREG is not connected to a contact. In similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some embodiments, a contact is not formed on the upper metal pattern 2392 formed in the uppermost metal layer of the cell region CREG.

Figure 28:
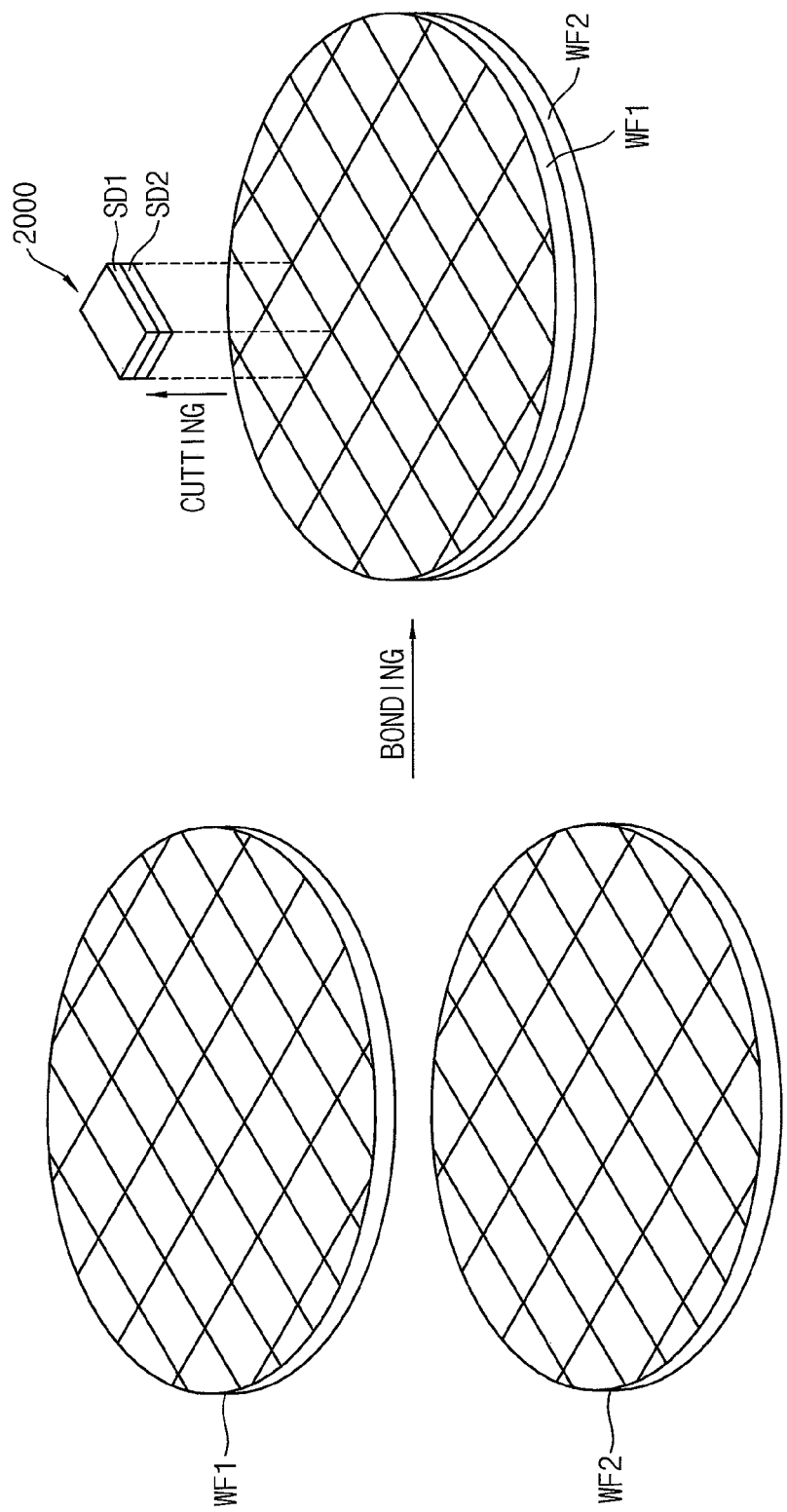
FIG. 28 is a conceptual diagram illustrating manufacture of a stacked semiconductor device according to example embodiments.

FIG. 28 is a conceptual diagram illustrating manufacture of a stacked semiconductor device according to example embodiments.

Referring to FIG. 28, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

As described above, the nonvolatile memory device and the method of programming in the nonvolatile memory device according to example embodiments may reduce program voltage disturbance and pass voltage disturbance and thus increase performance and lifetime of the nonvolatile memory device through independent switching of the intermediate switching transistors to implement local boosting of string segments irrelevant to programming.

The present inventive concept may be applied to any electronic devices and systems requiring the PIM of the encrypted data. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the spirit and scope of the following claims.

What is claimed is:
1. A nonvolatile memory device comprising:
a plurality of first metal pads in a cell region;
a plurality of second metal pads in a peripheral region under the cell region, wherein the peripheral region is vertically connected to the cell region by the first metal pads and the second metal pads;
a first memory block in the cell region, the first memory block being divided into a plurality of sub blocks and including a plurality of cell strings each comprising a plurality of memory cells connected in series and disposed in a vertical direction;
a plurality of intermediate switching transistors disposed in a boundary portion between two adjacent sub blocks in the first memory block in the vertical direction; and
a control circuit in the peripheral region, the control circuit being configured to selectively turn on one or more intermediate switching transistors in a selected cell string of the first memory block independently of intermediate switching transistors in unselected cell strings of the first memory block based on a program address during a program operation, wherein the control circuit is configured such that when a selected word line corresponding to the program address is included in a first sub block below the boundary portion, the control circuit turns on the one or more intermediate switching transistors in the selected cell string and turns off intermediate switching transistors in the unselected cell strings.

2. The nonvolatile memory device of claim 1, wherein the control circuit is configured such that when a selected word line corresponding to the program address is included in a second sub block above the boundary portion, the control circuit turns off the plurality of intermediate switching transistors.

3. The nonvolatile memory device of claim 1, further comprising:
an address decoder configured to provide a plurality of voltages to word lines based on the program address,
wherein the control circuit is configured such that when a selected word line corresponding to the program address is included in the first sub block, the address decoder provides a program voltage to the selected word line, a first pass voltage to unselected word lines included in the first sub block, and a second pass voltage lower than the first pass voltage to or floating unselected word lines included in a second sub block above the boundary portion.

4. The nonvolatile memory device of claim 1, wherein the plurality of intermediate switching transistors disposed in the boundary portion includes a first set of intermediate switching transistors and a second set of intermediate switching transistors, wherein each intermediate switching transistor of the first set of intermediate switching transistors is disposed adjacent to and is connected to a respective intermediate switching transistor of the second set of intermediate switching transistors in the vertical direction.

5. The nonvolatile memory device of claim 1, wherein each of the plurality of cell strings includes:
a first memory cell connected to a first word line formed adjacent to the boundary portion, and configured to store a number of bits smaller than a number of bits stored in each memory cell other than the first memory cell.

6. The nonvolatile memory device of claim 1, wherein the plurality of first metal pads and the plurality of second metal pads are formed of copper.

7. The nonvolatile memory device of claim 1, wherein the plurality of first metal pads and the plurality of second metal pads are connected by a bonding manner.

8. The nonvolatile memory device of claim 1, wherein the cell region is formed on a first wafer and the peripheral region is formed on a second wafer.

9. A method of programming in a nonvolatile memory device, the nonvolatile memory device comprising a cell region including a plurality of first metal pads and a peripheral region including a plurality of second metal pads and vertically connected to the cell region by the plurality of first metal pads and the plurality of second metal pads, the method comprising:
providing a memory block in the cell region, the memory block comprising a plurality of sub blocks disposed in a vertical direction where the memory block includes a plurality of cell strings connected to a plurality of bit lines, each cell string comprising a plurality of memory cells connected in series and disposed in the vertical direction;
providing a plurality of intermediate switching transistors disposed in a boundary portion between two adjacent sub blocks in the vertical direction; and
selectively activating, by a control circuit in the peripheral region, each of the plurality of intermediate switching transistors based on a program address during a program operation,
wherein selectively activating each of the plurality of intermediate switching transistors includes turning on one or more intermediate switching transistors in a selected cell string and turning off one or more intermediate switching transistors in an unselected cell string adjacent to the selected cell string in a first direction, based on the program address, and
wherein the selected cell string and the unselected cell string are connected to a first bit line of the plurality of bit lines.

10. The method of claim 9, wherein a selected word line corresponding to the program address is included in a sub block below the boundary portion, and
wherein selectively activating each of the plurality of intermediate switching transistors includes:
turning off intermediate switching transistors in unselected cell strings of the memory block other than the unselected cell string adjacent to the selected cell string.

11. The method of claim 9, wherein a selected word line corresponding to the program address is included in a sub block above the boundary portion, and
wherein selectively activating each of the plurality of intermediate switching transistors includes:
turning off the plurality of intermediate switching transistors regardless of the program address.

12. The method of claim 9, wherein the plurality of cell strings includes a plurality of string groups each connected to the same bit line, wherein each of the string groups is electrically connected to the same bit line through a respective string selection transistor, the method further comprising:
independently activating the plurality of intermediate switching transistors by units of the string groups based on the program address during the program operation.

13. The method of claim 9, wherein a selected word line corresponding to the program address is included in a first sub block below the boundary portion, and further comprising:
applying a first pass voltage to unselected word lines included in the first sub block and applying a second pass voltage lower than the first pass voltage to unselected word lines included in a second sub block above the boundary portion while applying a program voltage to the selected word line.

14. The method of claim 9, wherein a selected word line corresponding to the program address is included in a second sub block above the boundary portion, and further comprising:
applying a pass voltage to unselected word lines included in the second sub block and floating or applying a low voltage lower than the pass voltage to unselected word lines included in a first sub block below the boundary portion while applying a program voltage to the selected word line.

15. The method of claim 9, wherein a selected word line corresponding to the program address is included in a first sub block below the boundary portion, and further comprising:

applying the same pass voltage to unselected word lines included in the first sub block and a second sub block above the boundary portion while applying a program voltage to the selected word line.

16. The method of claim 15, wherein a selected word line corresponding to the program address is included in the second sub block, and further comprising:

applying the same pass voltage to unselected word lines included in the first and second sub blocks while applying the program voltage to the selected word line.

17. A method of programming in a nonvolatile memory device, the nonvolatile memory device comprising a cell region including a plurality of first metal pads and a peripheral region including a plurality of second metal pads and vertically connected to the cell region by the plurality of first metal pads and the plurality of second metal pads, the method comprising:

providing a memory block in the cell region, the memory block comprising a first sub block below a stopper layer and a second sub block above the stopper layer where the memory block includes a plurality of cell strings connected to a plurality of bit lines, each cell string comprising a plurality of memory cells connected in series and disposed in a vertical direction;

providing a plurality of intermediate switching transistors disposed in the stopper layer;

turning on, by a control circuit in the peripheral region, one or more intermediate switching transistors in a selected cell string in response to a first string selection transistor connected to a first bit line of the plurality of bit lines in the selected cell string being activated during a program operation; and turning off, by the control circuit, the one or more intermediate switching transistors in an unselected cell string adjacent to the selected cell string in a first direction in response to a second string selection transistor connected to the first bit line in the unselected cell string being inactivated during the program operation.

18. The method of claim 17, further comprising:

in response to a selected word line being included in the first sub block, applying a first pass voltage to unselected word lines in the first sub block and applying a second pass voltage equal to or less than the first pass voltage to unselected word lines in the second sub block while applying a program voltage to the selected word line; and in response to the selected word line being included in the second sub block, floating or applying a low pass voltage less than the second pass voltage to the unselected word lines in the first sub block and applying the first pass voltage to the unselected word lines in the second sub block, while applying the program voltage to the selected word line.

19. The method of claim 17, further comprising:

in response to a selected word line being included in the first sub block, applying a first pass voltage to unselected word lines in the first sub block and applying a second pass voltage equal to or less than the first pass voltage to unselected word lines in the second sub block, while applying a program voltage to the selected word line; and in response to the selected word line being included in the second sub block, applying the first pass voltage to the unselected word lines in the first and second sub blocks, while applying the program voltage to the selected word line.

* * * * *